(12) United States Patent
Konishi

(10) Patent No.: US 12,550,400 B2
(45) Date of Patent: Feb. 10, 2026

(54) MANUFACTURING METHOD OF SEMICONDUCTOR DEVICE

(71) Applicant: RENESAS ELECTRONICS CORPORATION, Tokyo (JP)

(72) Inventor: Kouichi Konishi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 398 days.

(21) Appl. No.: 18/177,478

(22) Filed: Mar. 2, 2023

(65) Prior Publication Data

US 2023/0378281 A1    Nov. 23, 2023

(30) Foreign Application Priority Data

May 17, 2022    (JP) ................................ 2022-080809

(51) Int. Cl.
     *H10D 64/01*      (2025.01)
     *H01L 21/02*      (2006.01)
     *H01L 21/3065*      (2006.01)
     *H01L 21/311*      (2006.01)
     *H01L 21/3213*      (2006.01)
     *H01L 21/768*      (2006.01)
     *H10D 12/01*      (2025.01)

(52) U.S. Cl.
CPC ....... *H10D 64/01* (2025.01); *H01L 21/02071* (2013.01); *H01L 21/3065* (2013.01); *H01L 21/31116* (2013.01); *H01L 21/32135* (2013.01); *H01L 21/76805* (2013.01); *H10D 12/038* (2025.01); *H01L 21/76843* (2013.01); *H01L 21/76883* (2013.01)

(58) Field of Classification Search
CPC . H10D 64/01; H10D 12/038; H01L 21/02071
USPC ........................................................ 438/586
See application file for complete search history.

(56) References Cited

U.S. PATENT DOCUMENTS

| | | | |
|---|---|---|---|
| 10,600,896 B2 | 3/2020 | Matsuo et al. | |
| 2011/0018029 A1* | 1/2011 | Pfirsch | H10D 64/117 |
| | | | 257/E29.198 |
| 2019/0035920 A1* | 1/2019 | Nagata | H10D 64/23 |
| 2019/0067029 A1* | 2/2019 | Kuneshita | H10D 12/481 |
| 2020/0212209 A1* | 7/2020 | Nagata | H10D 12/038 |
| 2021/0351284 A1* | 11/2021 | Kubouchi | H10D 64/232 |
| 2022/0069111 A1* | 3/2022 | Imai | H10D 64/117 |
| 2023/0335604 A1* | 10/2023 | Konishi | H10D 62/142 |

FOREIGN PATENT DOCUMENTS

JP      2018-046053 A      3/2018

\* cited by examiner

*Primary Examiner* — Igwe U Anya
(74) *Attorney, Agent, or Firm* — Rimon P.C.

(57) ABSTRACT

Increasing in a contact-resistance between a trench gate lead-out electrode and a gate lead-out contact member is suppressed. It is assumed that a natural oxidation film is formed in the polysilicon film when the trench gate lead-out electrode is formed. In case of the natural oxidation film is formed, a desired etching process is performed so that the natural oxidation film does not protrude beyond the upper surface of the trench gate lead-out electrode.

13 Claims, 37 Drawing Sheets

MANUFACTURING METHOD OF SEMICONDUCTOR DEVICE

CROSS-REFERENCE TO RELATED APPLICATIONS

The disclosure of Japanese Patent Application No. 2022-080809 filed on May 17, 2022, including the specification, drawings and abstract is incorporated herein by reference in its entirety.

BACKGROUND

The present disclosure relates to a semiconductor device and method of manufacturing the same, and more particularly, relates to an injection enhanced type insulated gate bipolar transistor.

In a power semiconductor device, an insulated gate bipolar transistor (IGBT) is provided as a switching device. In addition, semiconductor device has an IE effect (effect of electron injection enhancement effect) is also provided in order to lower an on-voltage as shown in Japanese Patent Laid-Open No. JP-A-2018-46053 (Patent Document 1).

In this type of the semiconductor device, an area is formed to prevent holes injected from the collector side passing through to the emitter (electrode) side. As a result, a concentration of the holes accumulated in a drift layer in a semiconductor substrate increases, and electrons injected from the emitter side is enhanced. Therefore, a concentration of the electrons also increases. As the concentration of carriers (electrons and holes) increases, a conductivity modulation occurs, and the on-voltage can be lowered.

The IGBT is formed in the cell area. In an outer region of the cell region, a trench gate lead-out electrode electrically connected to the trench gate electrode of IGBT is formed. The trench gate lead-out electrode is formed so as to have a width (wide width portion) wider than a width of the trench gate electrode. The trench gate lead-out electrode is electrically connected to a gate electrode via a gate lead-out contact member contacted on the wide width portion of the trench gate lead-out electrode.

SUMMARY

In this type of semiconductor device, in particular, the trench gate lead-out electrode is formed by filling a wide trench with a polysilicon film. At this time, it is assumed that a natural oxidation film is formed in the polysilicon film. When natural oxidation film is formed in the polysilicon film, the gate lead-out contact member does not make good contact with the trench gate lead-out electrode due to natural oxidation film. And it may increase the contact-resistance.

Other objects and novel features will become apparent from the description of this specification and the accompanying drawings.

A manufacturing method of a semiconductor device according to an embodiment includes a step of forming a first trench having a first width and a second trench having a second width greater than the first width on a semiconductor substrate having a first main surface and a second main surface opposite to the first main surface, forming a first trench electrode a second trench electrode by sequentially laminating a first conductive film and a second conductive film so as to embed in the first trench and the second trench respectively, forming an interlayer insulating film on the first main surface, forming a first contact opening penetrating through the interlayer insulating film and exposing an upper surface of the first trench electrode and the first main surface and forming a second contact opening penetrating through the interlayer insulating film and exposing an upper surface of the second trench electrode, etching the upper surface of the first trench electrode and the first main surface exposed from the first contact opening, and the upper surface of the second trench electrode exposed from the second contact opening, respectively, and embedding a contact member in the first contact opening and the second contact opening. The step of performing an etching process includes retreating the upper surface of the first trench electrode and the first main surface exposed from the first contact opening, and the upper surface of the second trench electrode exposed from the second contact opening, in a thickness direction of the semiconductor substrate respectively and removing residue left inside the first contact opening and the second contact opening.

According to manufacturing method of semiconductor device according to the embodiment, it is possible to suppress an increase in the contact-resistance.

DETAILED DESCRIPTION

In a semiconductor device having an IE type insulated gate bipolar transistor, for example, there is a GE type semiconductor device which is emphasized on-voltage reduction. The GE type is a structure in which the trench gate electrode electrically connected to a gate electrode and a trench emitter electrode electrically connected to an emitter electrode are spaced apart from each other.

And other example, there is a GGEE type semiconductor device which is emphasized on stable and balanced operation. The GGEE type is a structure in which one trench emitter electrode and other trench emitter electrode are spaced apart from each other, and one trench gate electrode and other trench gate electrode are spaced apart from each other. One trench emitter electrode and other trench emitter electrode and the one trench gate electrode and the other trench gate electrode are spaced apart from each other by a predetermined distance.

In addition, yet another example, there is a EGE type semiconductor device which is emphasized on high-speed performance. The EGE type is a structure in which one trench emitter electrode, one trench gate electrode, and other trench emitter electrode are spaced apart from each other. Hereafter, a concrete description will be given.

Figure 1:
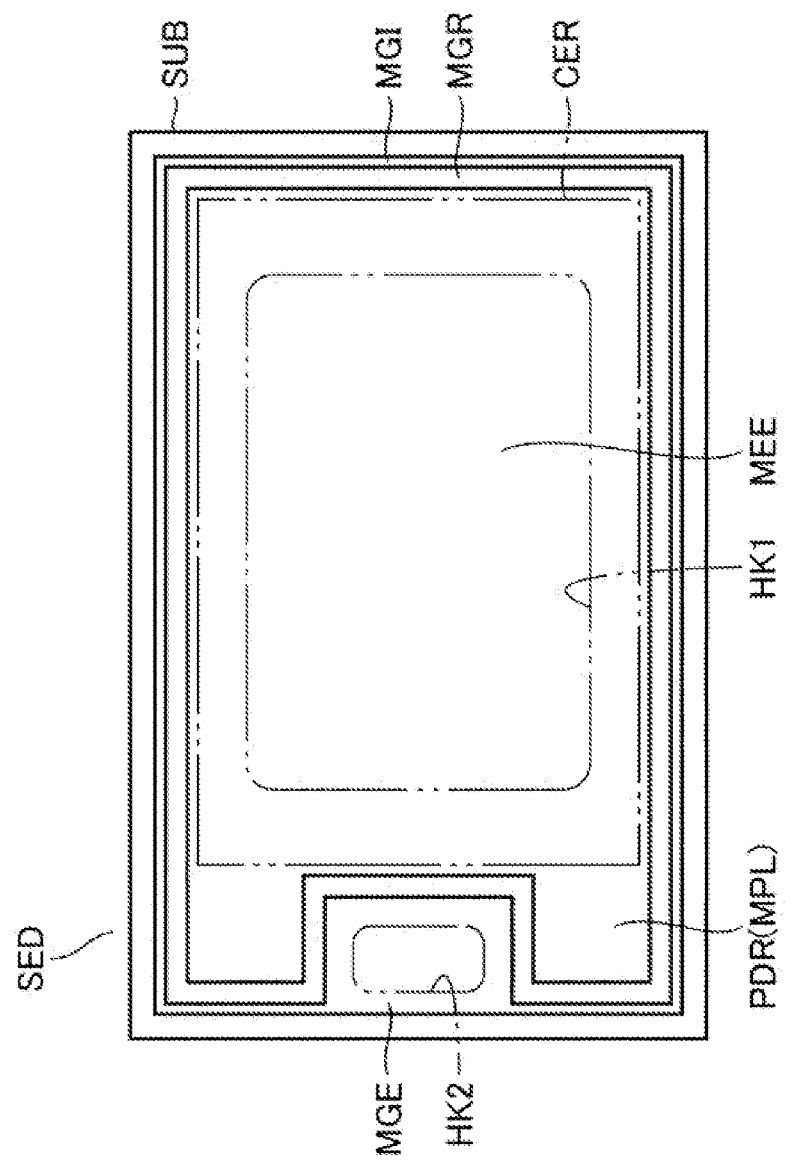
FIG. 1 is a plan view illustrating an exemplary semiconductor device according to each embodiment.

First, an exemplary entire structure of the semiconductor device having an IE insulated gate type bipolar transistor will be described. As shown in FIG. 1, a cell region CER and a gate wiring lead-out region MGR are defined in the semiconductor device SED (semiconductor substrate SUB).

The IE type insulated gate bipolar transistor is formed in the cell region CER. The emitter electrode MEE is formed in the cell region CER so as to cover the cell region CER. The emitter electrode MEE is exposed at a bottom of an opening HK1 formed in an interlayer insulating film (not shown) covering the emitter electrode MEE (semiconductor substrate SUB).

The gate wiring lead-out region MGR is arranged so as to surround the cell region CER. In the gate wiring lead-out region MGR, a gate lead-out wiring MGI and the gate electrode MGE are formed. The gate lead-out wiring MGI is electrically connected to the gate electrode MGE. The gate electrode MGE is exposed at the bottom of an opening HK2 formed in the interlayer insulating film (not shown) covering the gate electrode MGE (semiconductor substrate SUB).

Further, the semiconductor device SED (semiconductor substrate SUB) defines a peripheral element area PDR in which peripheral elements such as a protective diode or a temperature sensing diode are formed.

FIRST EMBODIMENT

Figure 2:
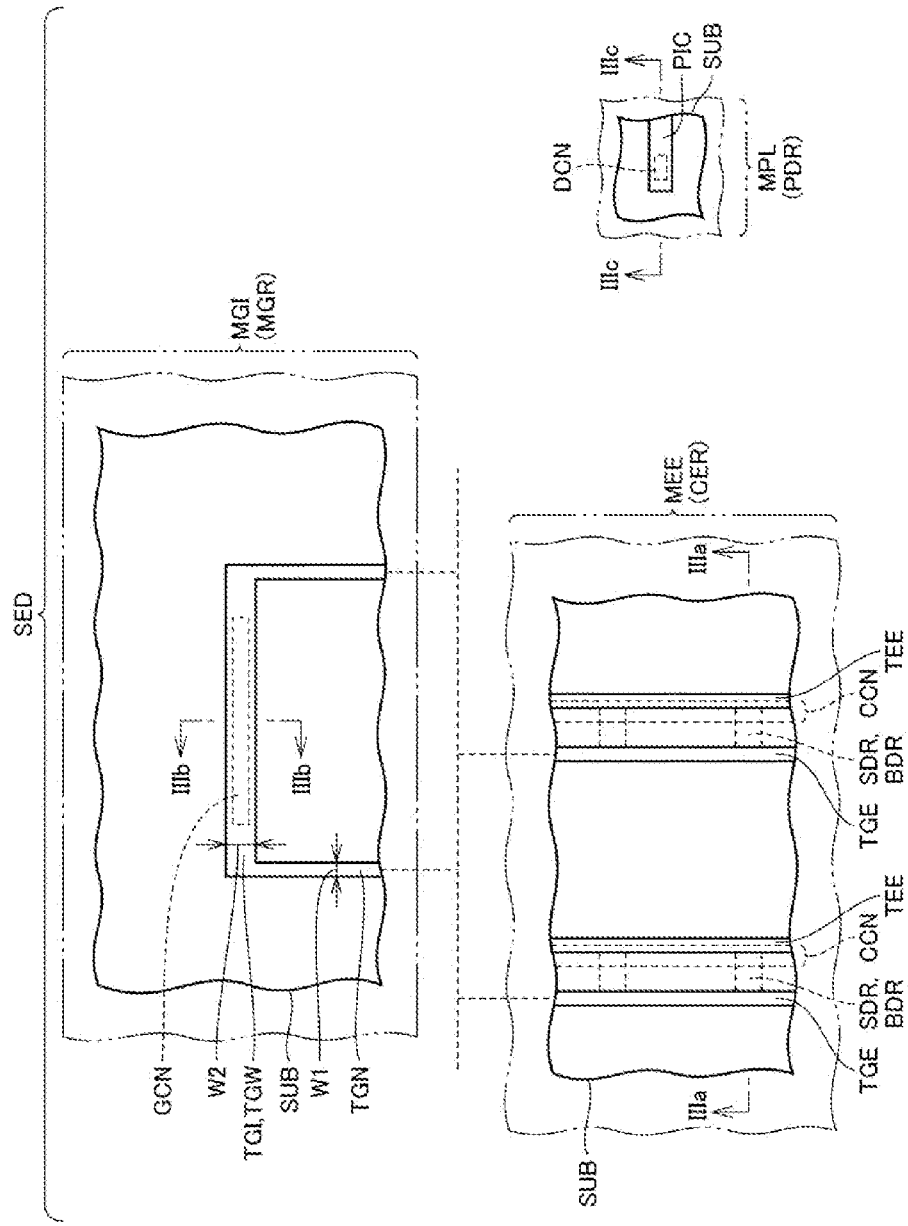
FIG. 2 is a partial plan view illustrating an exemplary plane structure of a semiconductor device in a first embodiment.
Figure 3:
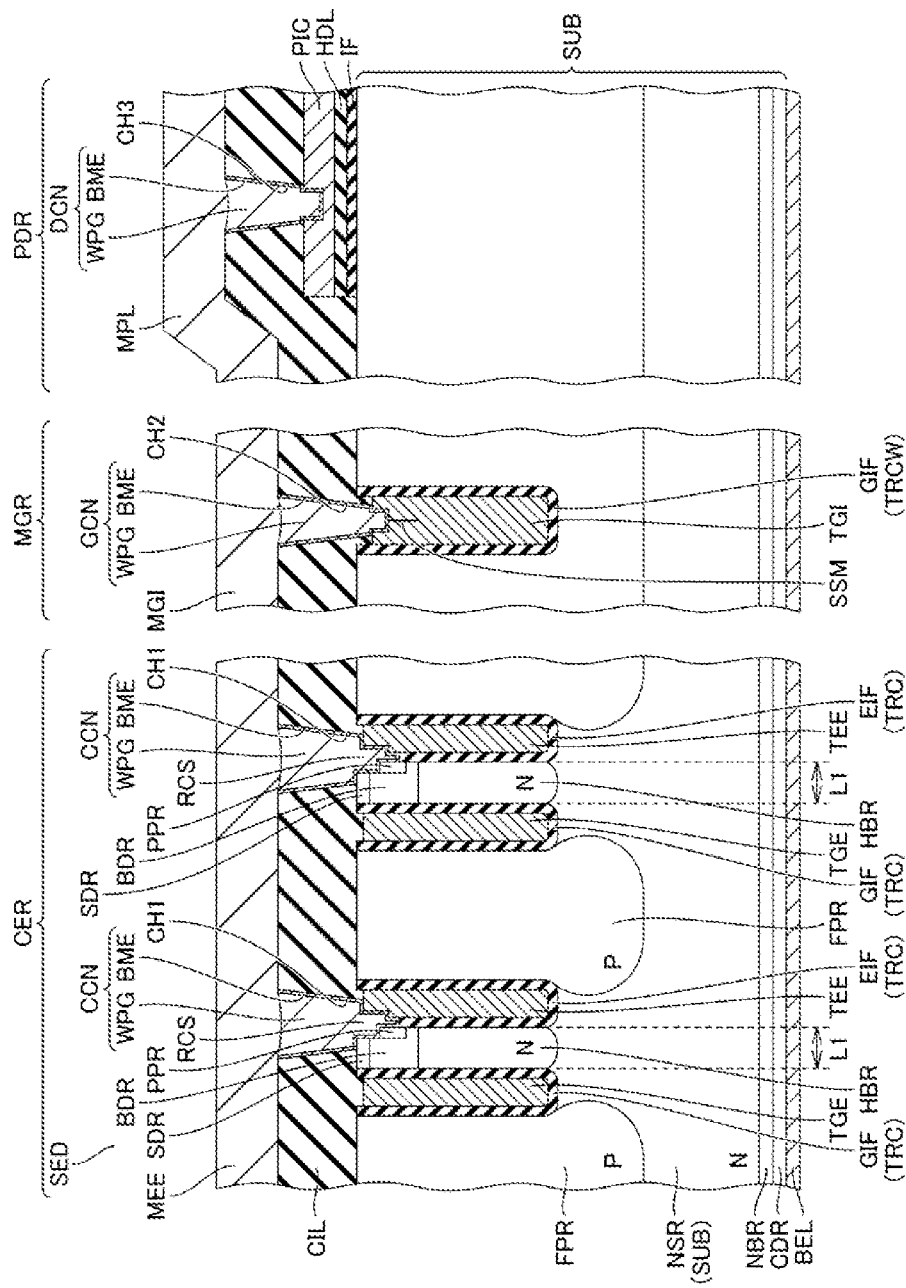
FIG. 3 is a cross-sectional view showing a cross-sectional structure at each of a line IIIa-IIIa, a line IIIb-IIIb and a line IIIc-IIIc shown in FIG. 2 together in the first embodiment.

Here, an exemplary GE type semiconductor device SED will be described. First, a cell region CER will be described. As shown in FIGS. 2 and 3, in the cell region CER, a trench gate electrode TGE (third trench gate electrode) and a trench emitter electrode TEE (first trench emitter electrode) are arranged spaced apart from each other in a first direction. The trench gate electrode TGE and the trench emitter electrode TEE respectively extend in a second direction intersecting the first direction.

The trench gate electrode TGE is formed via a trench insulating film GIF (insulating film IF) in a trench TRC (third trench). The trench emitter electrode TEE is formed via a trench insulating film EIF (insulating film IF) in other trench TRC (first trench). The trenches TRC are formed on a semiconductor substrate SUB having an N-type region NSR (drift layer) from a first main surface toward a second main surface opposite to the first main surface.

In a region (first region) of the semiconductor substrate SUB located between the trench gate electrode TGE and the trench emitter electrode TEE, a source diffusion layer SDR (third impurity region) of N-type is formed over a predetermined depth from the first main surface. A P-type base diffusion layer BDR (first impurity region) is formed from a bottom of the source diffusion layer SDR to a predetermined depth. In the base diffusion layer BDR, a P+ layer PPR having a higher P-type impurity concentration is formed. An impurity concentration of the second P+ layer PPR is higher than an impurity concentration of the base diffusion layer BDR. An N-type hole barrier layer HBR is formed from a bottom of the base diffusion layer BDR to a predetermined depth. The hole barrier layer HBR is formed to reach a bottom (lower end) of the trench gate electrode TGE and the trench emitter electrode TEE. A region in which the hole barrier layer HBR is formed is referred to as an active region.

A P-type floating diffusion layer FPR is formed from the first main surface to a position deeper than a bottom portion (lower end portion) of the trench gate electrode TGE in a region of the semiconductor substrate SUB, and located on a side opposite to the trench emitter electrode TEE with respect to the trench gate electrode TGE. Further, the P-type floating diffusion layer FPR is formed from the first main surface to a position deeper than a bottom portion (lower end portion) of the trench emitter electrode TEE in a region of the semiconductor substrate SUB, and located on a side opposite to the trench gate electrode TGE with respect to the trench emitter electrode TEE. The floating diffusion layer FPR is referred to as an inactive area.

An interlayer insulating film CIL is formed so as to cover the trench gate electrode TGE, the trench emitter electrode TEE, the source diffusion layer SDR, and the like. A shared contact member CCN (first contact member) is formed through interlayer insulating film CIL and contacts the trench emitter electrode TEE, the base diffusion layer BDR (P+ layer PPR), the source diffusion layer SDR, and the like. The shared contact member CCN includes a barrier metal film BME and a tungsten plug WPG.

A recess RCS recessed on the semiconductor substrate SUB from the first main surface toward the second main surface is formed in the trench emitter electrode TEE and the base diffusion layer BDR. The shared contact member CCN protrudes from the first main surface toward the second main surface in a manner contacting the recess RCS. A space L1 between the trench emitter electrode TEE and the trench gate electrode TGE is set so that the shared contact member CCN does not contact with the trench gate electrode TGE.

An emitter electrode MEE is formed so as to be contacted with an upper surface of the interlayer insulating film CIL. The shared contact member CCN is electrically connected to the emitter electrode MEE. The emitter electrode MEE is formed of, for example, an aluminum film or the like.

On the other hand, a P-type collector diffusion layer CDR and an N-type buffer layer NBR are formed on the second main surface of the semiconductor substrate SUB. The N-type region NSR as the drift layer is located between the floating diffusion layer FPR and the buffer layer NBR. A collector electrode BEL (bottom surface electrode) is formed so as to be contacted with the collector diffusing layer CDR on the second main surface of the semiconductor substrate SUB.

Next, a gate wiring lead-out region MGR will be described. In the gate wiring lead-out region MGR, a trench gate lead-out electrode TGI (second trench gate electrode) is formed. The trench gate lead-out electrode TGI is formed via the trench insulating film GIF in a trench TRCW (second trench). As shown in FIGS. 2 and 3, the trench gate lead-out electrode TGI is electrically connected to the trench gate electrode TGE. The trench gate lead-out electrode TGI (trench TRCW (second trench)) has a first lead-out portion TGN that is set to a first width W1 same as the width of the trench gate electrode TGE (trench TRC (third trench)), and a second lead-out portion TGW that is set to a second width W2 greater than the first width W1.

A gate lead-out contact member GCN is formed so as to penetrate the interlayer insulating film CIL and contacts the second lead-out portion TGW of the trench gate lead-out electrode TGI. The gate lead-out contact member GCN includes a barrier metal film BME and a tungsten plug WPG. A gate lead-out wiring MGI is formed so as to contact an upper surface of the interlayer insulating film CIL. The gate lead-out contact member GCN is electrically connected to the gate lead-out wiring MGI. The gate lead-out wiring MGI is formed of, for example, an aluminum film or the like.

Next, the peripheral element area PDR will be described. In the peripheral element area PDR, a wiring PIC is formed on the first main surface of the semiconductor substrate SUB via an insulating film IF and a silicon oxide film HDL. The wiring PIC is electrically connected to peripheral elements (not shown), for example, a protective diode or a temperature sensing diode and the like. A contact member DCN is formed through the interlayer insulating film CIL and contacts the wiring PIC. A conductive layer MPL electrically connected to the wiring PIC is formed on the interlayer insulating film CIL via the contact member DCN.

In the semiconductor device SED described above, in particular, it is assumed that a natural oxidation film SSM is formed in the polysilicon film when the trench gate lead-out electrode TGI is formed. In case of the natural oxidation film SSM is formed, a desired etching process is performed so that the natural oxidation film SSM does not protrude beyond the upper surface of the trench gate lead-out electrode TGI (the upper surface of the polysilicon film).

Figure 4:
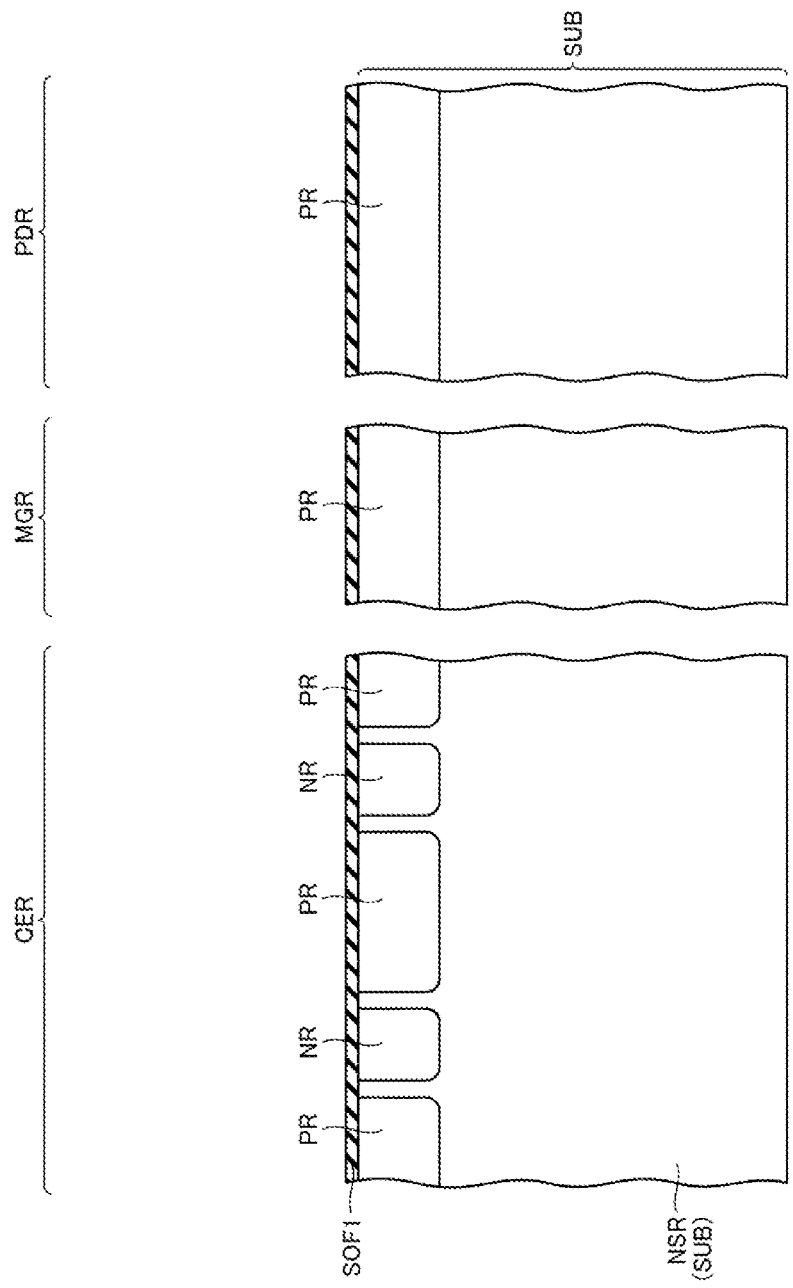
FIG. 4 is a cross-sectional view showing a step of a manufacturing method of a semiconductor device in the first embodiment.

Next, an exemplary manufacturing method of the above-described semiconductor device SED will be described. As shown in FIG. 4, a silicon oxide film SOF1 is formed so as to cover the first main surface of the semiconductor substrate SUB. Next, while the silicon oxide film SOF1 is formed, P-type impurities are implanted to form P-type regions PR to be floating diffusion layer. In addition, N-type regions NR to be hole barrier layer is formed by implanting N-type impurities.

Figure 5:
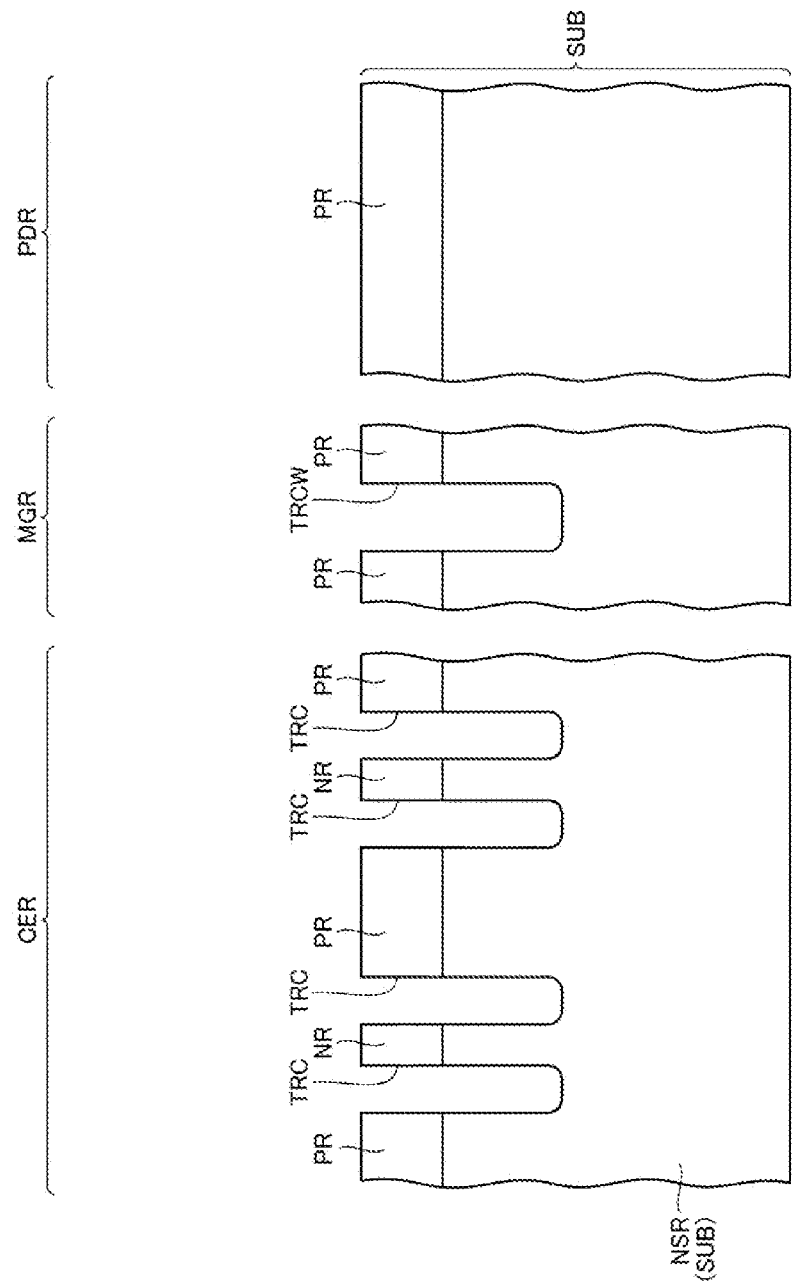
FIG. 5 is a cross-sectional view showing a step performed after the step shown in FIG. 4 in the first embodiment.

Next, a hard mask (not shown) is then formed to form trenches. Next, the semiconductor substrate SUB is performed to an etching process using the hard mask as an etching mask, whereby the trenches TRC (first trench, third trench) and the trench TRCW (second trench) are formed (see FIG. 5). Thereafter, the hard mask is removed. As a result, as shown in FIG. 5, the first main surface of the semiconductor substrate SUB in which the trenches TRC and the trench TRCW are formed is exposed. The trench TRCW is formed to have a width larger than the width of the trenches TRC.

Figure 6:
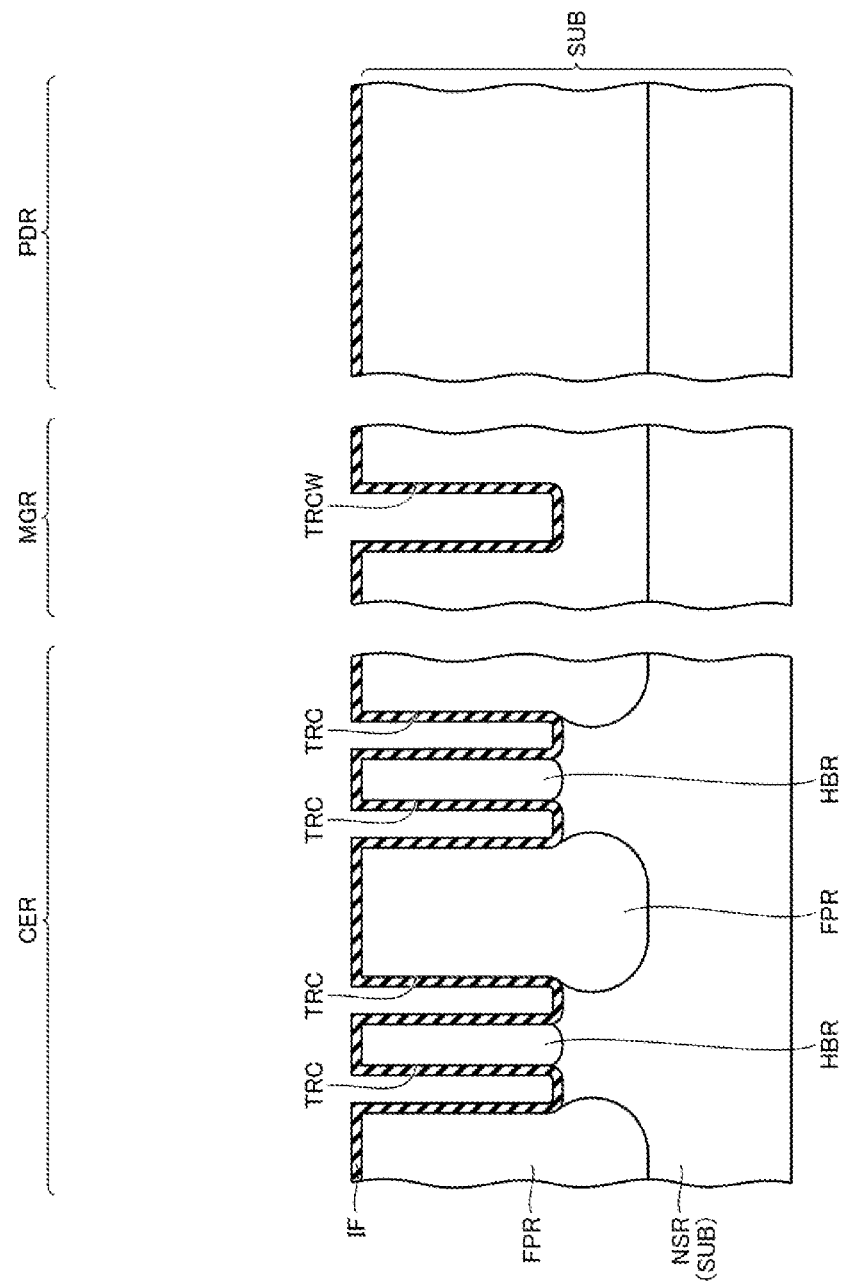
FIG. 6 is a cross-sectional view showing a step performed after the step shown in FIG. 5 in the first embodiment.

Next, a predetermined heat treatment is performed to diffuse the P-type impurities in the P-type regions PR, thereby forming the floating diffusion layer FPR. In addition, the N-type impurities of the N-type regions NR are diffused, so that the hole barrier layer HBR is formed (see FIG. 6). Next, as shown in FIG. 6, the insulating film IF is formed on the first main surface of the semiconductor substrate SUB including inner wall surfaces of the trenches TRC and the trench TRCW by performing a thermal oxidization treatment.

Next, a polysilicon film PSF (see FIG. 8) is formed to cover the semiconductor substrate SUB in such a manner as to fill each of the trenches TRC and the trench TRCW. Here, in this example, the polysilicon film PSF is formed in two steps in order to reduce the grain size or the like.

Figure 7:
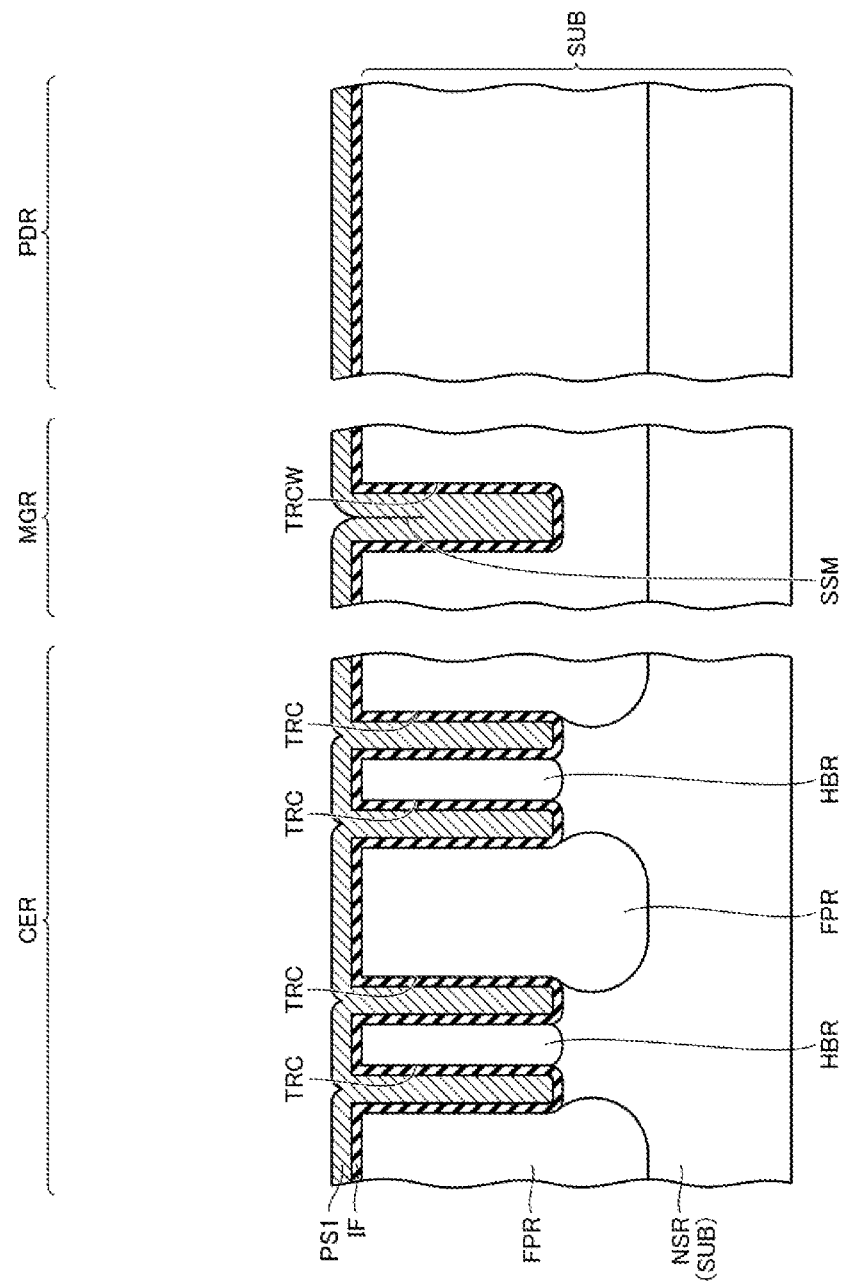
FIG. 7 is a cross-sectional view showing a step performed after the step shown in FIG. 6 in the first embodiment.
Figure 8:
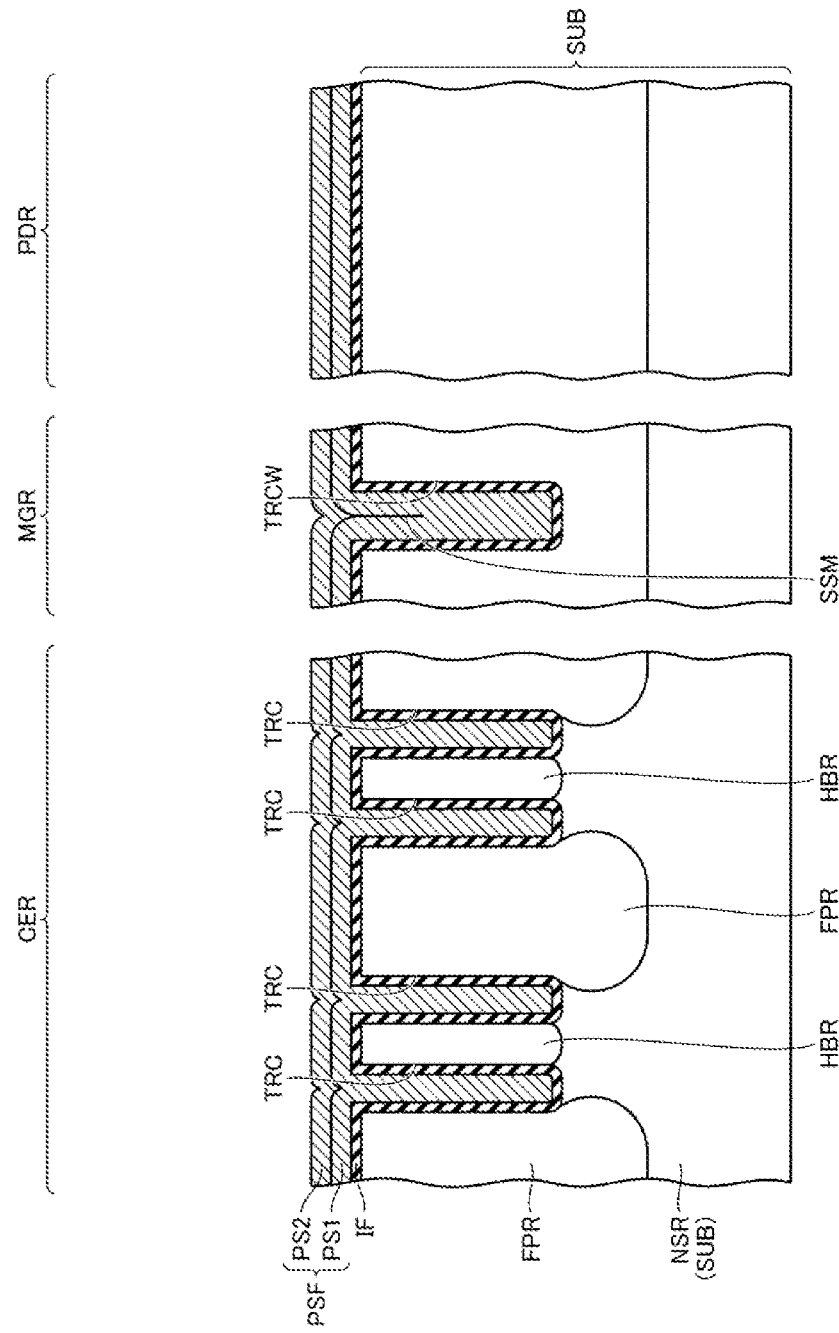
FIG. 8 is a cross-sectional view showing a step performed after the step shown in FIG. 7 in the first embodiment.

At first, as shown in FIG. 7, a first-layer polysilicon film PS1 (first conductive film) is formed. Semiconductor substrate SUB on which the first-layer polysilicon film PS1 is formed is taken out from a film forming device (not shown) and exposed to an atmosphere for the moment. At this time, it is assumed that a natural oxidation film SSM is formed on the upper surface of the first-layer polysilicon film PS1. Next, as shown in FIG. 8, a second-layer polysilicon film PS2 (second conductive film) is formed so as to cover the first-layer polysilicon film PS1.

Thus, a polysilicon film PSF composed of two layers of the first-layer polysilicon film PS1 and the second-layer polysilicon film PS2 is formed. At this time, the position of an upper surface of the polysilicon film PSF covered the trench TRCW having a relatively wide width is lower than an upper surface of the polysilicon film PSF covered the trench TRC having a relatively narrow width.

Figure 9:
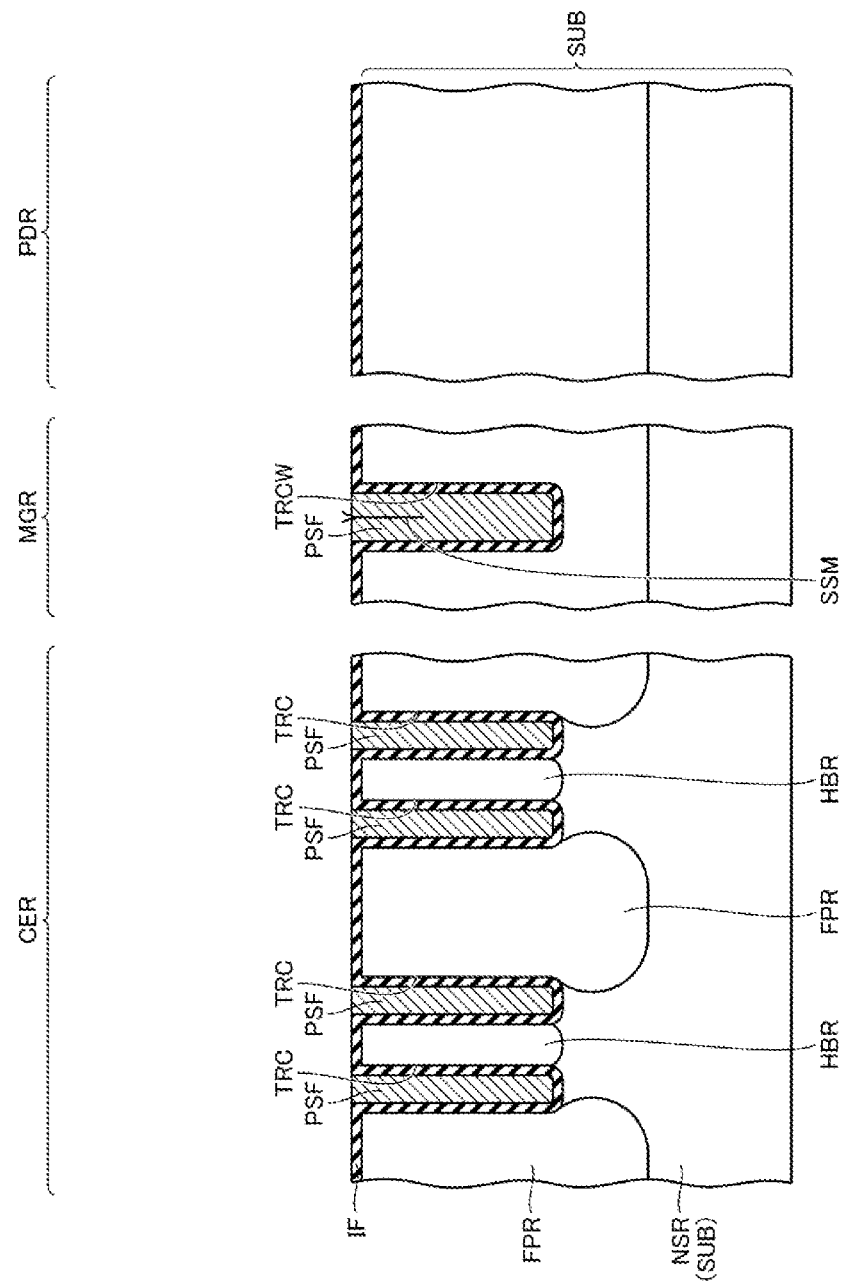
FIG. 9 is a cross-sectional view showing a step performed after the step shown in FIG. 8 in the first embodiment.
Figure 10:
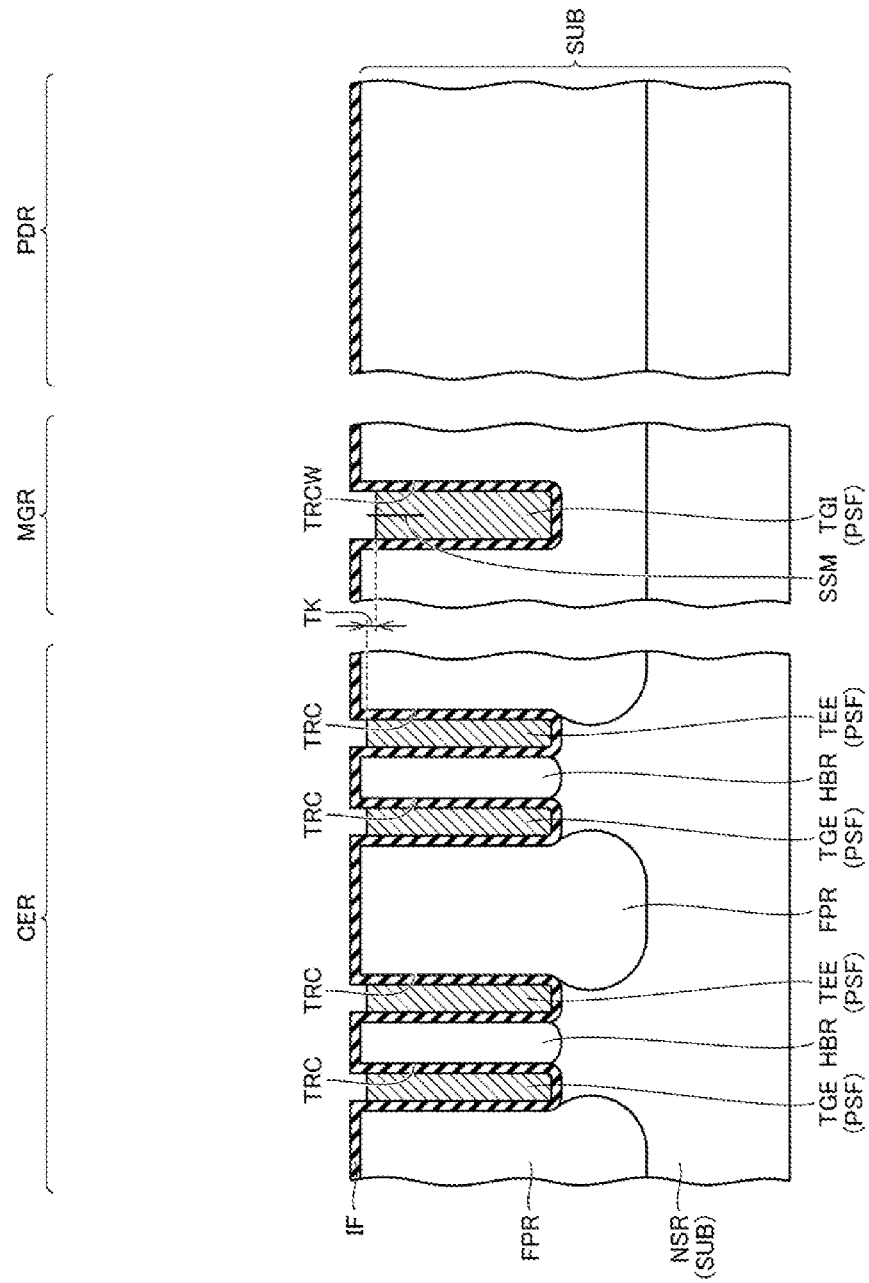
FIG. 10 is a cross-sectional view showing a step performed after the step shown in FIG. 9 in the first embodiment.

Next, as shown in FIG. 9, an entire surface of the polysilicon film PSF is etched to remove a part of the polysilicon film PSF located on the first main surface of the semiconductor substrate SUB. At this time, natural oxidation film SSM formed on the first-layer polysilicon film PS1 is exposed. Further, as shown in FIG. 10, the polysilicon film PSF is performed to an over etching. As a result, an upper surface of the polysilicon film PSF left in each of the trenches TRC and the trench TRCW is lower than the first main surface of the semiconductor substrate SUB.

At this time, in the state where the polysilicon film PSF is formed, the position of the polysilicon film PSF covering the trench TRCW is lower than the position of the polysilicon film PSF covering the trench TRC. Therefore, after the entire etching process is performed, the position of the upper surface of the polysilicon film PSF left in the trench TRCW is lower than the position of the upper surface of the polysilicon film PSF left in the trenches TRC. A natural oxidation film SSM is left so as to protrude from the upper surface of the polysilicon film PSF in the trench TRCW. Here, a thickness corresponding to a difference in height (thickness) is defined as a thickness TK.

Figure 11:
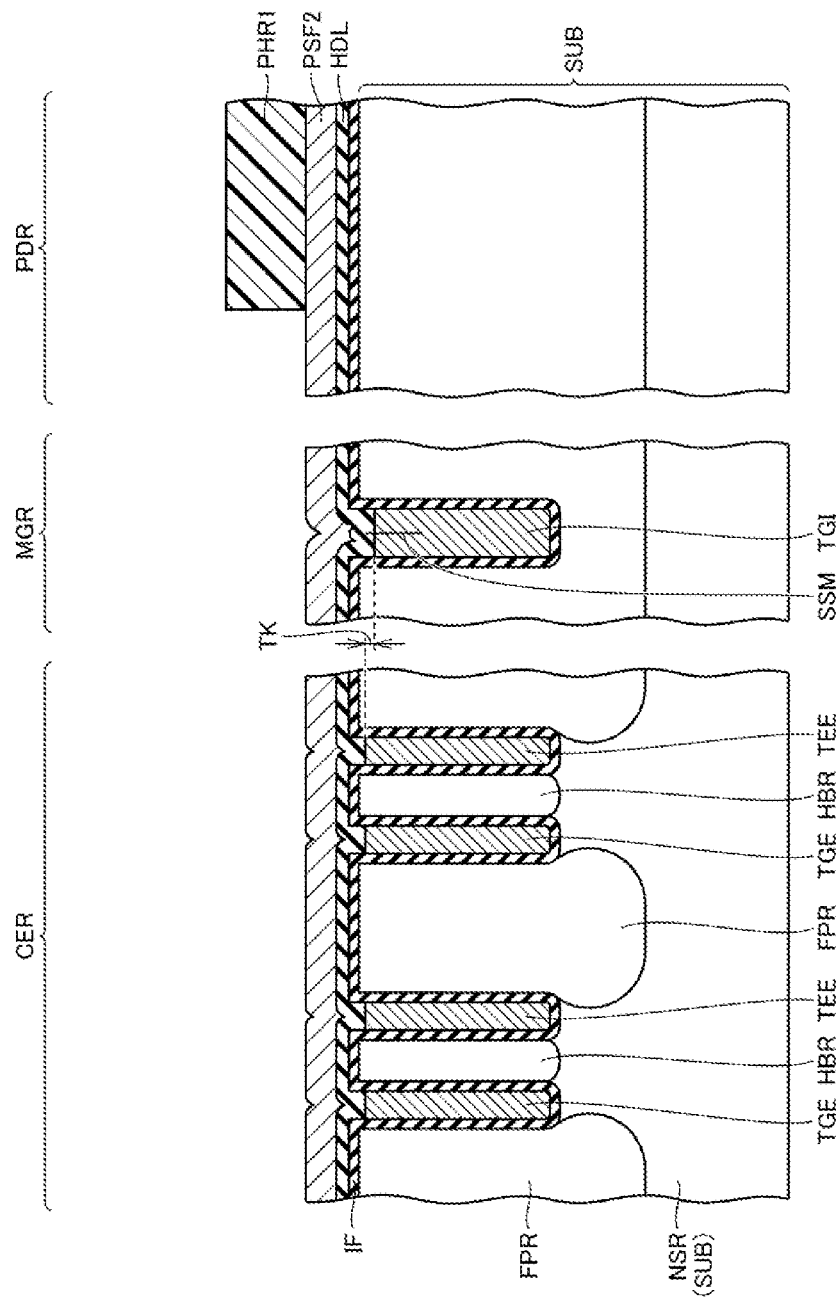
FIG. 11 is a cross-sectional view showing a step performed after the step shown in FIG. 10 in the first embodiment.

Next, as shown in FIG. 11, the silicon oxide film HDL is formed so as to cover the insulating film IF. Next, a polysilicon film PSF2 is formed so as to cover the silicon oxide film HDL. Next, a photoresist pattern PHR1 for patterning wiring is formed by performing a photolithography process.

Figure 12:
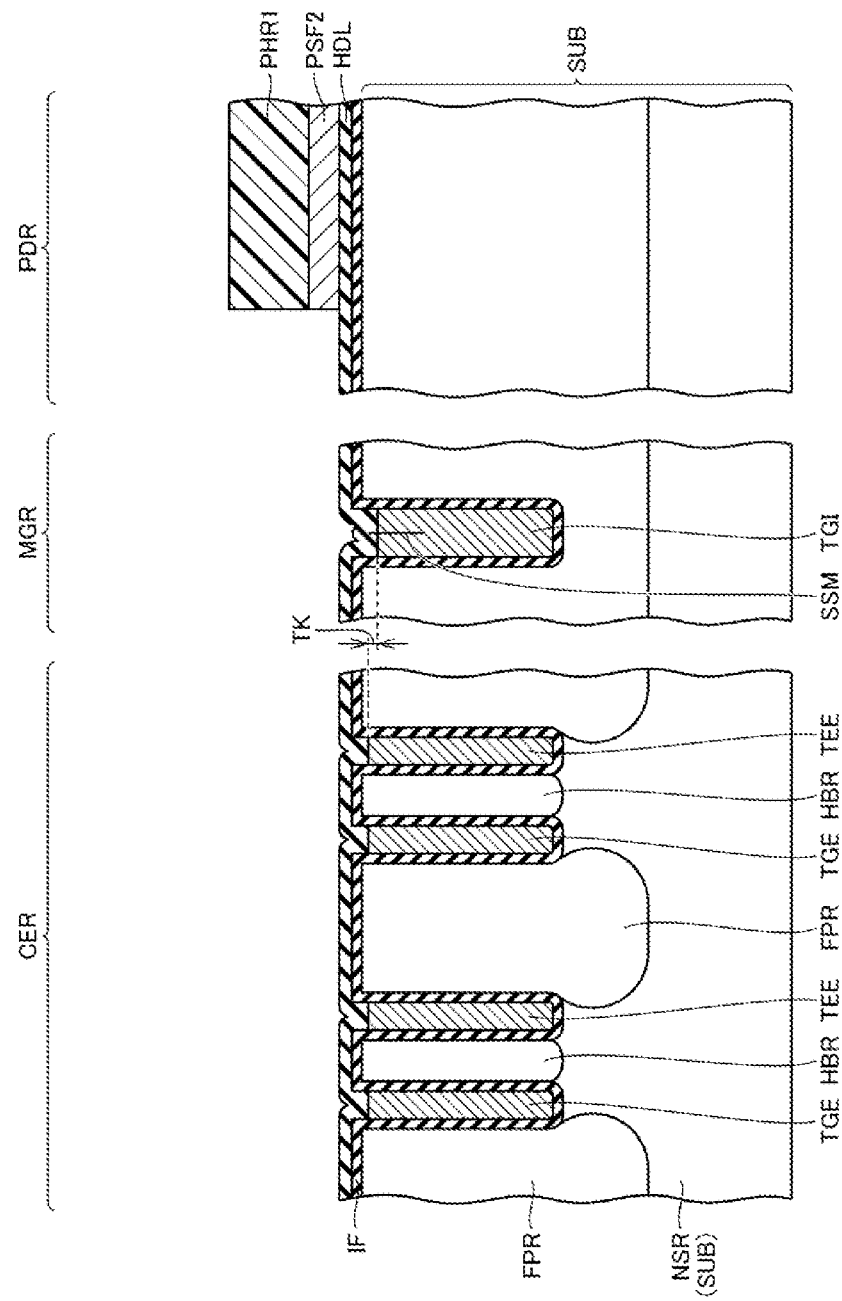
FIG. 12 is a cross-sectional view showing a step performed after the step shown in FIG. 11 in the first embodiment.
Figure 13:
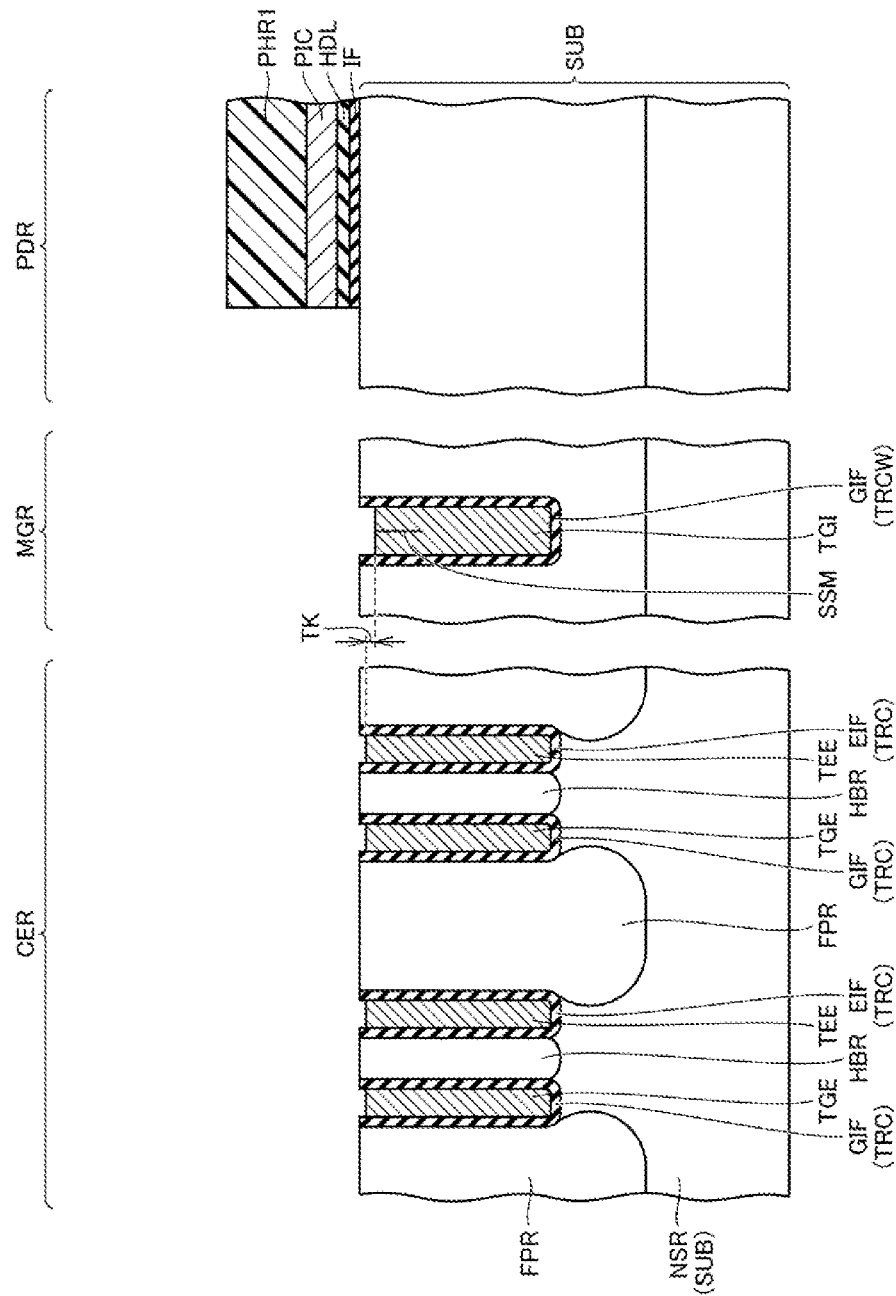
FIG. 13 is a cross-sectional view showing a step performed after the step shown in FIG. 12 in the first embodiment.

Next, as shown in FIG. 12, the wiring PIC is formed by performing an etching process on the polysilicon film PSF2 using the photoresist pattern PHR1 as an etching mask. Next, as shown in FIG. 13, an etching process is performed on the silicon oxide film HDL using the photoresist pattern PHR1 as an etching mask, and further, an etching process is performed on the insulating film IF to remove a portion of the silicon oxide film HDL located on the first main surface of the semiconductor substrate SUB and a portion of the insulating film IF. At this time, the natural oxidation film SSM protruding from the upper surface of the polysilicon film PSF is also removed together with the insulating film IF. Thereafter, the photoresist pattern PHR1 is removed.

As a result, the trench emitter electrode TEE (first trench electrode) is formed with the trench insulating film EIF (insulating film IF) interposed in the trench TRC. And the trench gate electrode TGE (third trench electrode) is formed with the trench insulating film GIF (insulating film IF) interposed in the trench TRC. And the trench gate lead-out electrode TGI (second trench electrode) is formed with the trench insulating film GIF (insulating film IF) interposed in the trench TRCW.

Figure 14:
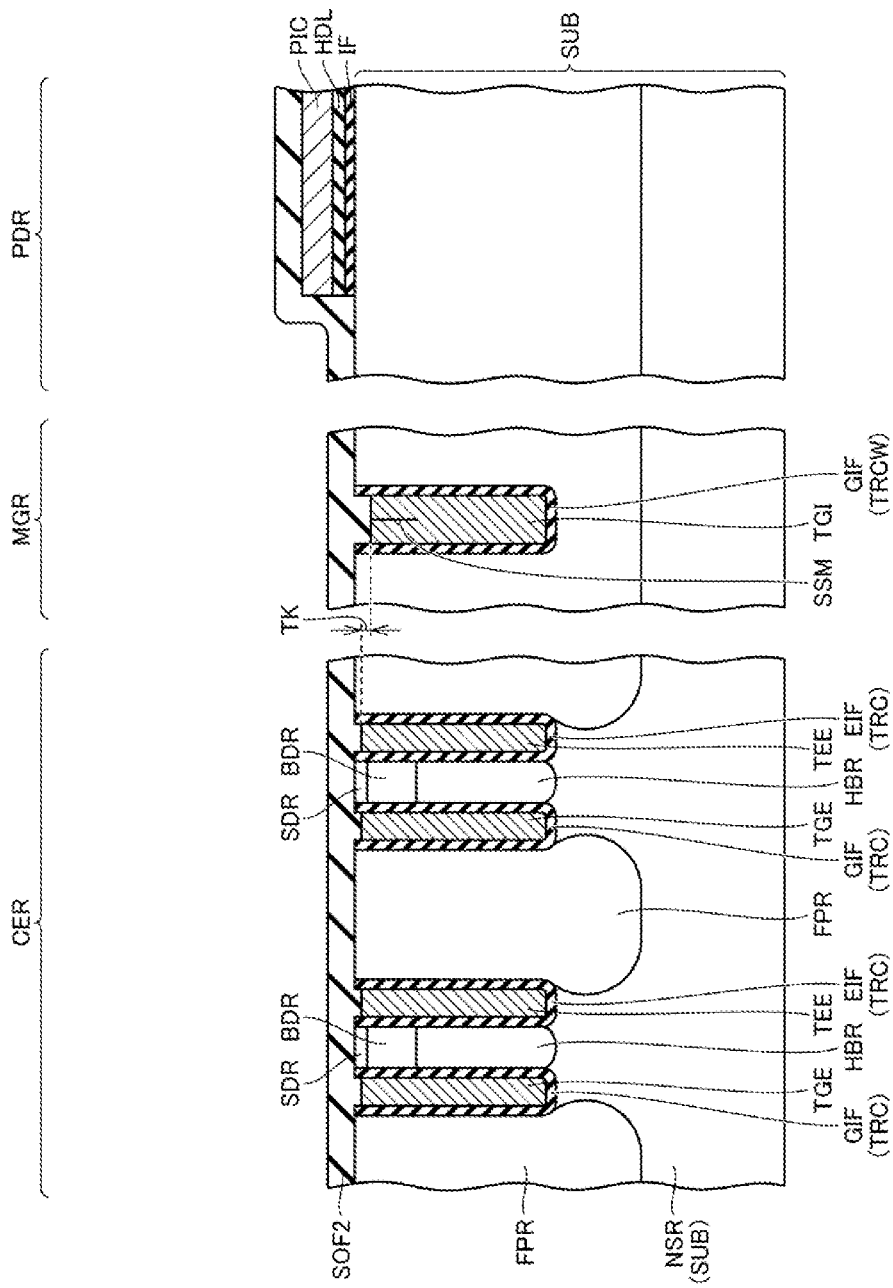
FIG. 14 is a cross-sectional view showing a step performed after the step shown in FIG. 13 in the first embodiment.

Next, as shown in FIG. 14, a silicon oxide film SOF2 is formed so as to cover the first main surface of the semiconductor substrate SUB. Next, a photoresist pattern (not shown) for forming the source diffusion layer and the base diffusion layer is formed by performing a predetermined photolithography process. Next, P-type impurities are implanted using the photoresist pattern as an implantation mask. Further, the N-type impurities are implanted. Thereafter, the photoresist pattern is removed.

As a result, the source diffusion layer SDR and the base diffusion layer BDR are formed in a region (first region) of the semiconductor substrate SUB located between the trench emitter electrode TEE and the trench gate electrode TGE. The source diffusion layer SDR is formed from the first main surface to a predetermined depth. The base diffusion layer BDR is formed over a deeper position from the bottom of the base diffusion layer BDR. Thereafter, the silicon oxide film SOF2 is removed.

Figure 15:
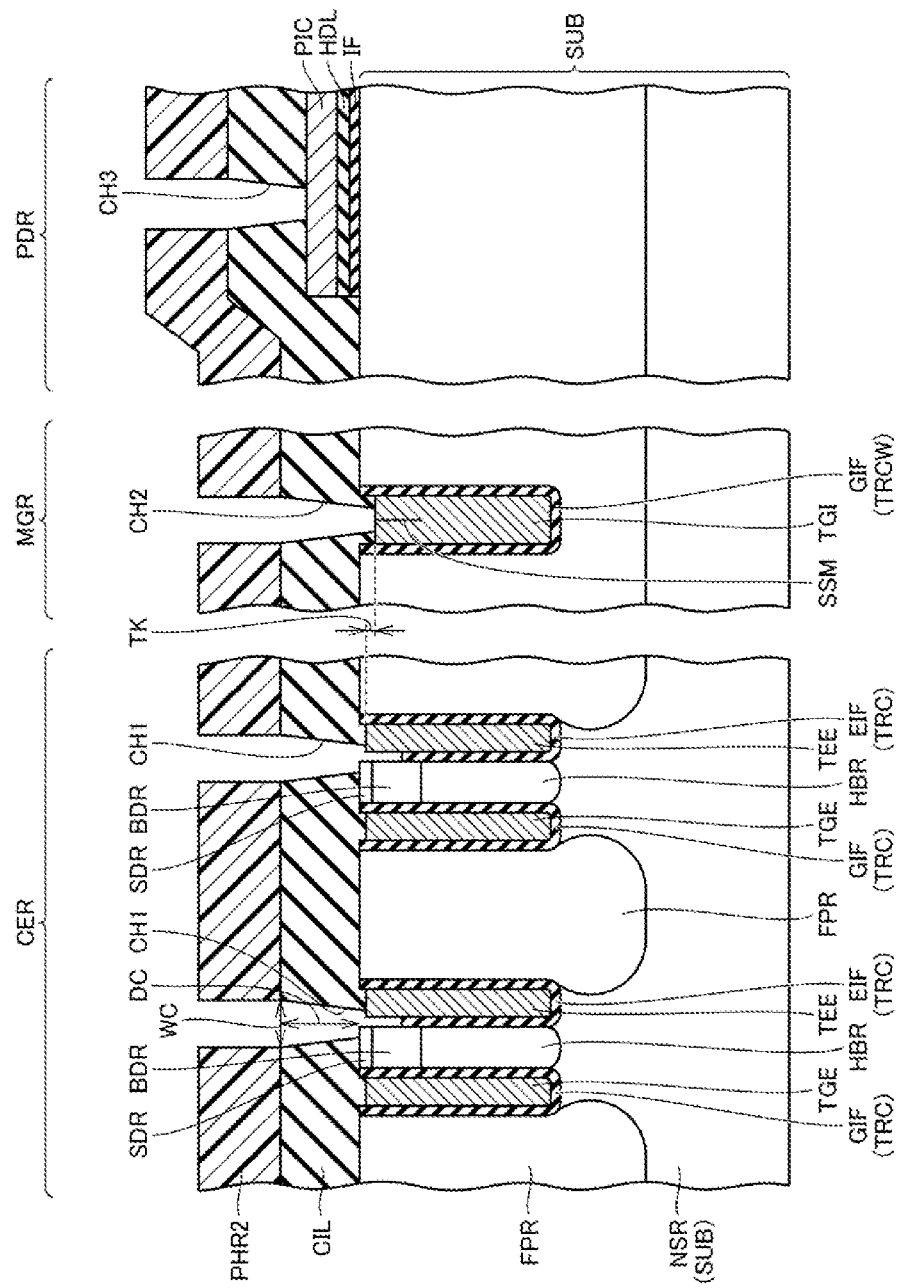
FIG. 15 is a cross-sectional view showing a step performed after the step shown in FIG. 14 in the first embodiment.

Next, the interlayer insulating film CIL is formed so as to cover the first main surface of the semiconductor substrate SUB (see FIG. 15). As the interlayer insulating film CIL, for example, a PSG film (Phospho Silicate Glass) is formed. Next, by performing a predetermined photolithography process, a photoresist pattern PHR2 for forming a contact opening is formed in the interlayer insulating film CIL (see FIG. 15).

Next, as shown in FIG. 15, an etching process is performed on the interlayer insulating film CIL using the photoresist pattern PHR2 as an etching mask. By this etching process, a contact opening CH1 (first contact opening), a contact opening CH2 (second contact opening), and a contact opening CH3 (fourth contact opening) are simultaneously formed.

Here, since an opening depth is large with respect to the opening width of the contact opening and the aspect ratio (the opening depth DC against opening width WC) is high (1.4 to 2.5), an anisotropic dry etching process is applied as an etching process. In this anisotropic dry etching, a condition is set such that an etching selectivity of an etching rate of the interlayer insulating film CIL (insulating film EIF) to an etching rate of the semiconductor substrate SUB (trench emitter electrode TEE) is high. By this anisotropic etch process, the contact opening CH1 and the like are formed in a tapered shape.

Further, as described above, a position of an upper surface of the trench gate lead-out electrode TGI (polysilicon film PSF) formed in the trench TRCW is lower than a position of an upper surface of the trench emitter electrode TEE (polysilicon film PSF) formed in the trenches TRC by the thickness TK.

Therefore, in this anisotropic dry etching, when the upper surface of the trench emitter electrode TEE is exposed, the trench gate lead-out electrode TGI is still covered with interlayer insulating film CIL state to the thickness TK. Then, after the trench emitter electrode TEE is exposed, the trench insulating film EIF interposed between the trench emitter electrode TEE and the base diffusion layer BDR (semiconductor substrate SUB) is also etched until the trench gate lead-out electrode TGI is exposed. As a result, the upper surface of the trench insulating film EIF is retracted and an exposed area of the base diffusion layer BDR is widened. Thereafter, the photoresist pattern PHR2 is removed.

Figure 16:
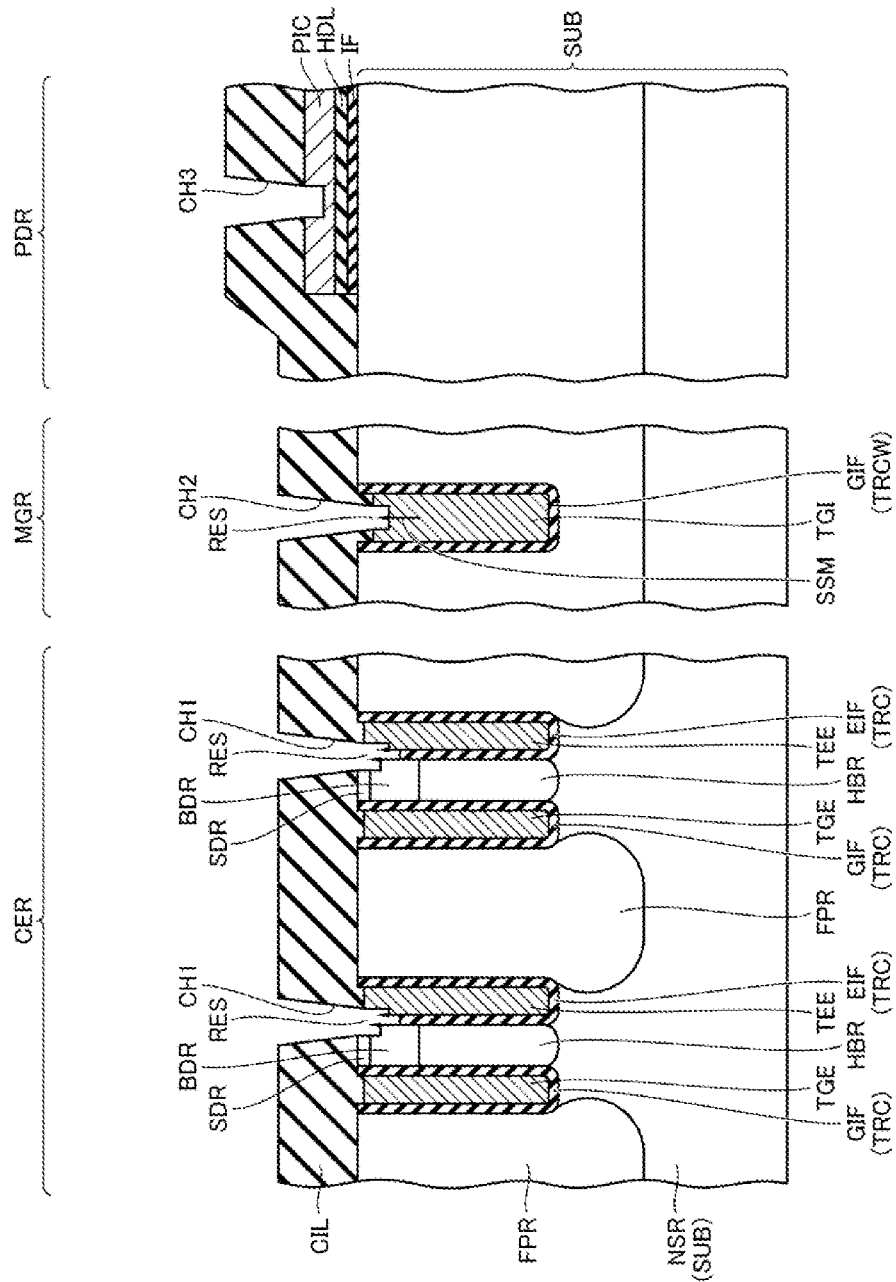
FIG. 16 is a cross-sectional view showing a step performed after the step shown in FIG. 15 in the first embodiment.

Next, as shown in FIG. 16, an anisotropic dry etching process (first etching process) is performed on the portions exposed at bottoms of the contact openings CH1, CH2, and CH3 respectively.

By the anisotropic dry etching process into the bottom of the contact opening CH1 that is exposed trench emitter electrode TEE, the base diffusion layer BDR and the source diffusion layer SDR, a part of the upper surface of the trench emitter electrode TEE and a part of the upper surface of the base diffusion layer BDR are recessed in a thickness direction of the semiconductor substrate. At this time, since the upper surface of the trench emitter electrode TEE was initially located at a position lower than the first main surface of the semiconductor substrate SUB (the upper surface of the base diffusion layer BDR), a recessed upper surface of the trench emitter electrode TEE is positioned lower than the upper surface of the base diffusion layer BDR.

And, by the anisotropic dry etching process into the bottom of the contact opening CH2 that is exposed trench gate lead-out electrode TGI, a part of the upper surface of the trench gate lead-out electrode TGI is retracted. Further, by the anisotropic dry etching process into the bottom of the contact opening CH3 that is exposed wiring PIC, a part of the upper surface of the wiring PIC is retracted.

Due to this anisotropic dry etching, a part of the trench insulating film EIF, a part of silicon (semiconductor substrate SUB, polysilicon) and the like remain as residue RES at the bottom of the contact opening CH1. Further, due to an exposed upper surface of the trench gate lead-out electrode TGI is recessed at the bottom of the contact opening CH2, the natural oxidation film SSM is exposed as a residue RES.

Figure 17:
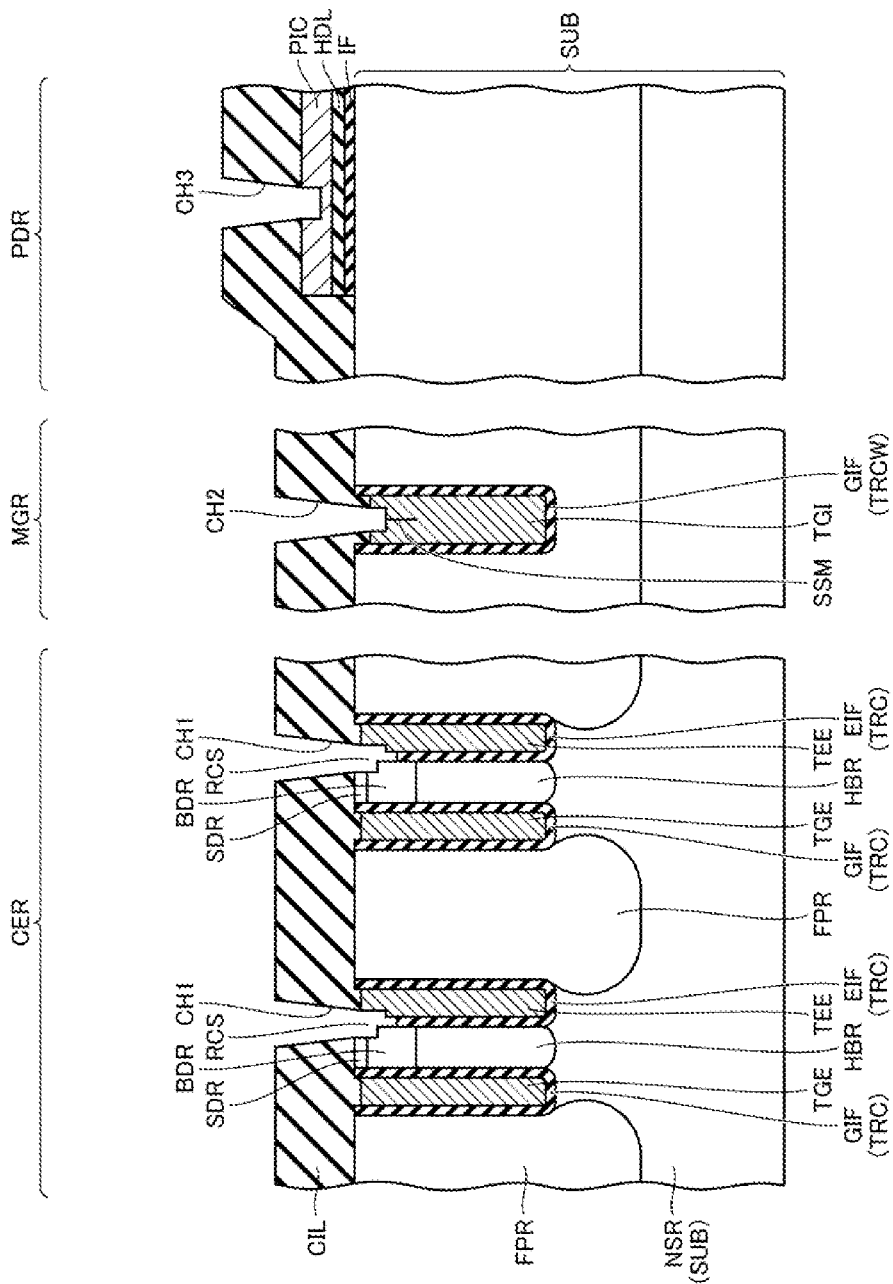
FIG. 17 is a cross-sectional view showing a step performed after the step shown in FIG. 16 in the first embodiment.

Next, as shown in FIG. 17, an additional etching process (second etching process) is performed into the exposed portions of the bottoms of the contact opening CH1, the contact opening CH2, and the like these are portions by the anisotropic dry etching is processed. Here, an isotropic dry etching process using gases containing CF4 gas is performed as the etching process (second etching process). By this isotropic dry etching process, the natural oxidation film SSM exposed as a residue RES at a bottom of the contact opening CH2 is removed. Also, the residue RES is removed at the bottom of the contact opening CH1 to form a recess RCS.

Figure 18:
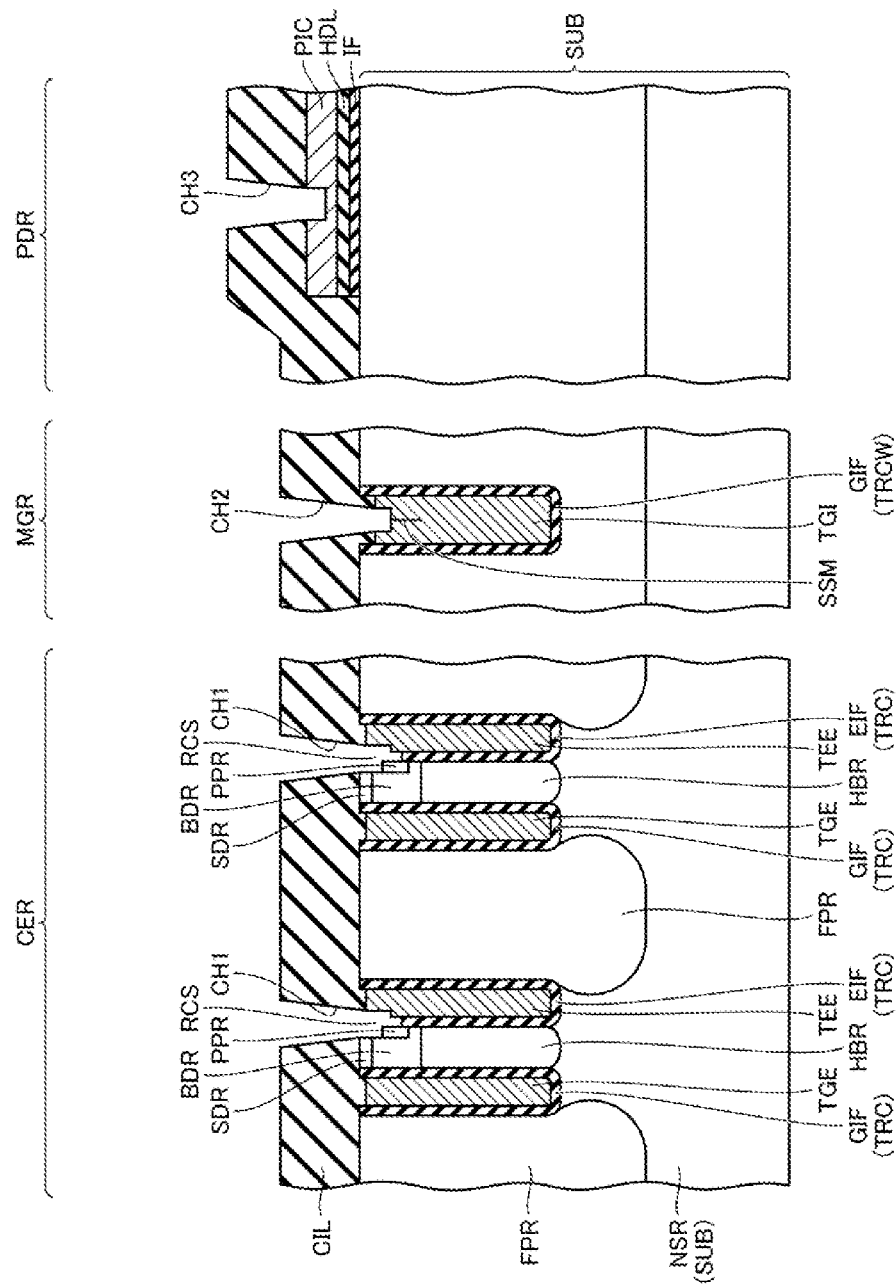
FIG. 18 is a cross-sectional view showing a step performed after the step shown in FIG. 17 in the first embodiment.

Next, as shown in FIG. 18, P-type impurities is implanted through the contact openings CH1 to CH3. At this time, the P+ layer PPR having an impurity concentration higher than the impurity concentration of the base diffusion layer BDR is formed on the base diffusion layer BDR exposed at the bottom (recess RCS) of the contact opening CH1. As a result, the contact resistance between the shared contact member CCN and the P+ layer PPR (the base diffusion layer BDR) is reduced.

On the other hand, at the bottom of the contact opening CH1, P-type impurities are also implanted into a side surface of the source diffusion layer SDR exposed in the recess RCS. Therefore, the N-type impurities of the source diffusion layer SDR that the shared contact member CCN contacts with may be neutralized by the P+ type impurities, and a contact resistivity between the source diffusion layer SDR and the shared contact member CCN may increase.

Figure 19:
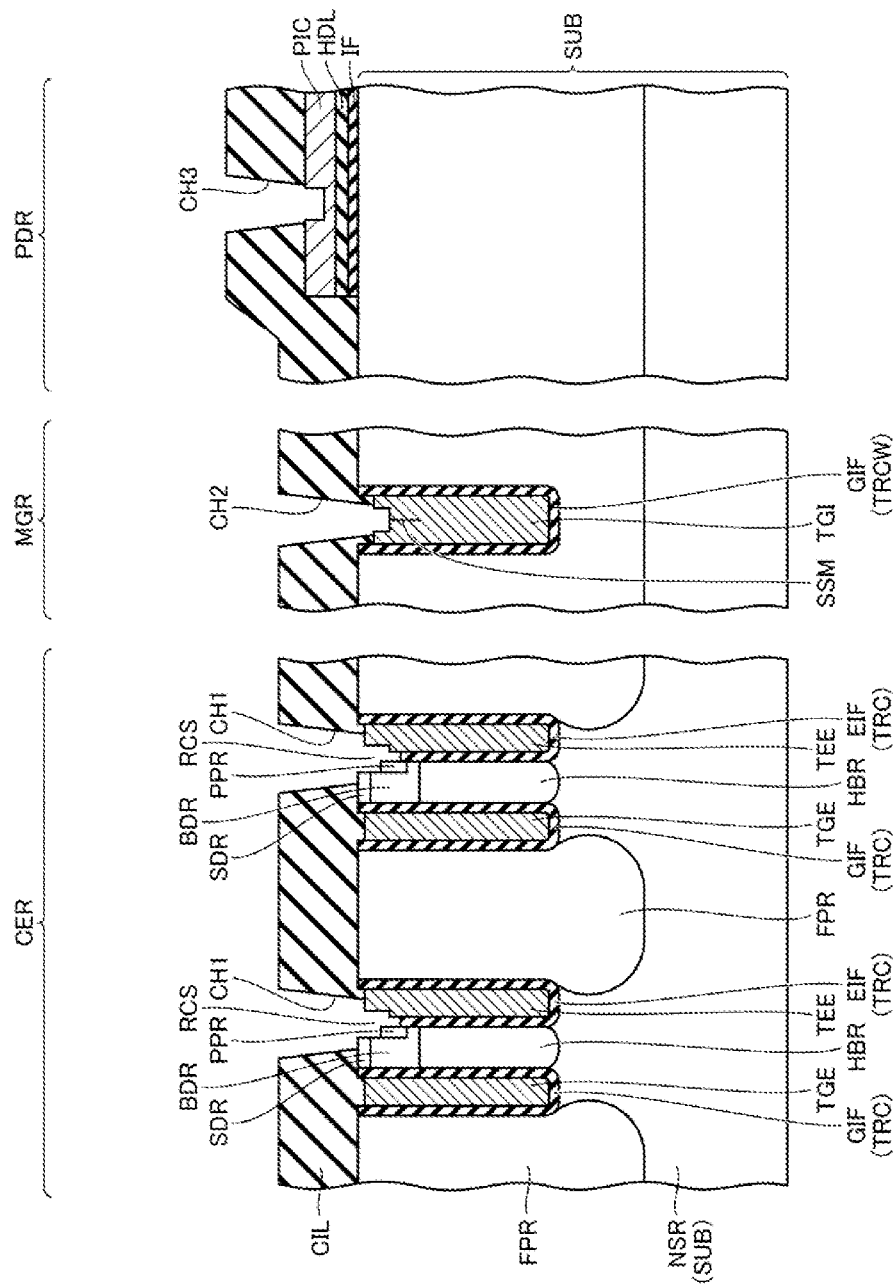
FIG. 19 is a cross-sectional view showing a step performed after the step shown in FIG. 18 in the first embodiment.

Then, as shown in FIG. 19, the interlayer insulating film CIL is performed to a wet etching process to widen an opening area of the contact opening CH1 or the like. By an opening of the contact opening CH1 is widened, so that an upper surface of the source diffusion layer SDR into which the P-type impurities PM is not implanted is exposed. Accordingly, a contact resistance between the shared contact member CCN and the source diffusion layer SDR is reduced.

Figure 20:
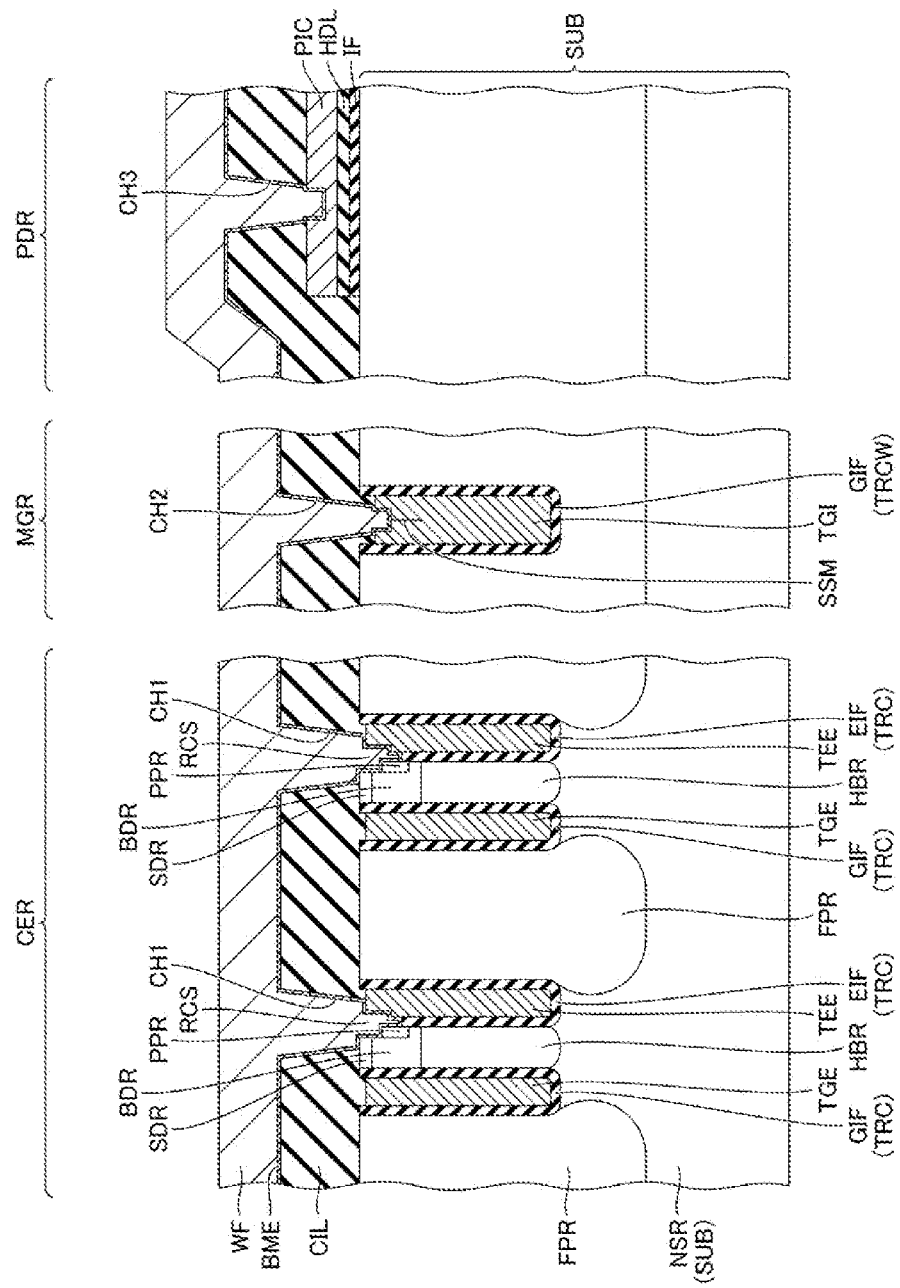
FIG. 20 is a cross-sectional view showing a step performed after the step shown in FIG. 19 in the first embodiment.

Next, as shown in FIG. 20, the barrier metal film BME is formed so as to cover the interlayer insulating film CIL including inner wall surfaces of the contact openings CH1 to CH3. As the barrier metal film BME, for example, a laminated film of titanium nitride (TiN) and titanium (Ti) is formed. Next, a tungsten film WF is formed so as to cover the barrier metal film BME. Next, the tungsten film WF and the barrier metal film BME located on an upper surface of the interlayer insulating film CIL are removed by performing an entire etch-back process on the tungsten film WF and the like.

Figure 21:
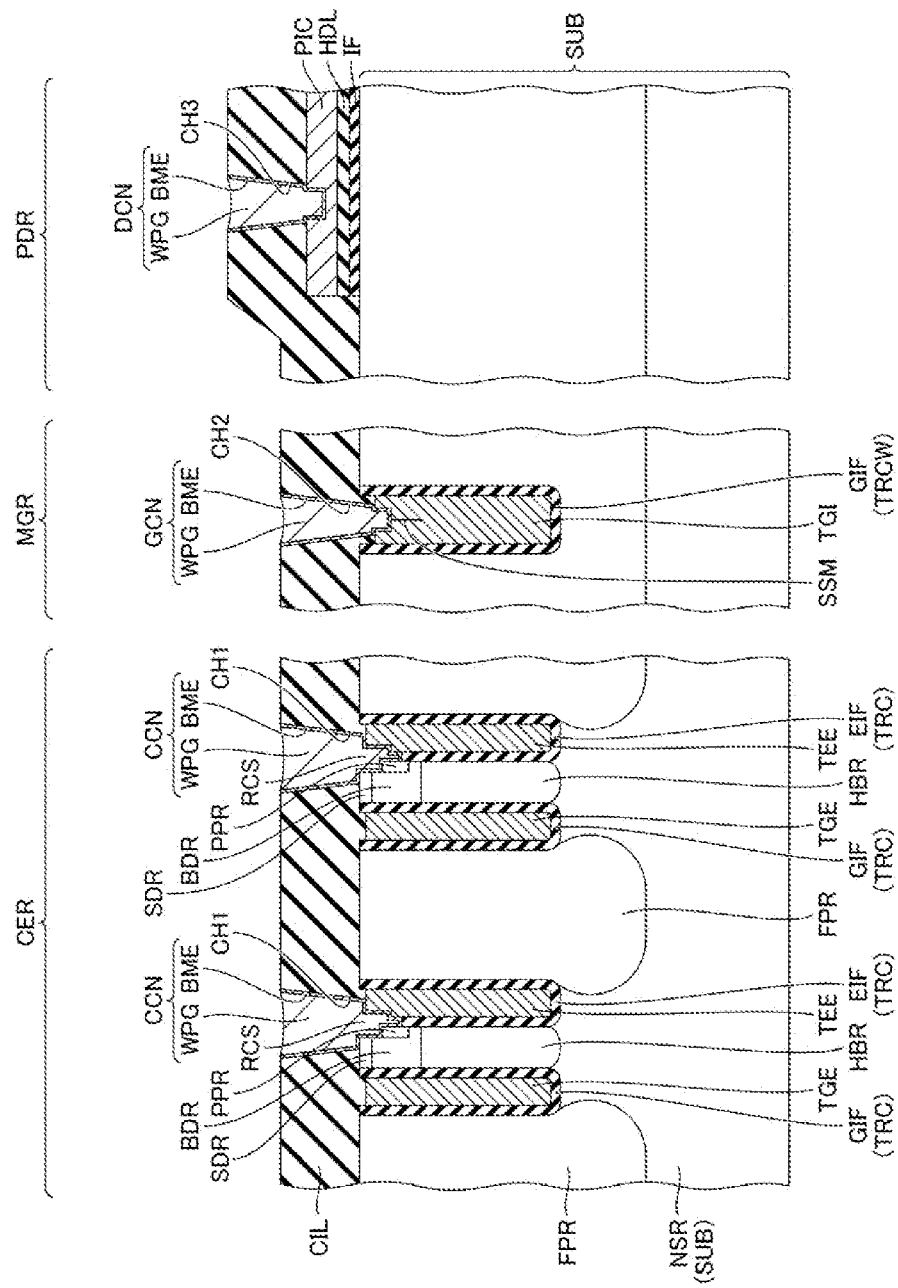
FIG. 21 is a cross-sectional view showing a step performed after the step shown in FIG. 20 in the first embodiment.

As a result, as shown in FIG. 21, the shared contact member CCN is formed by the tungsten film WF and the barrier metal film BME left in the contact opening CH1. The gate lead-out contact member GCN is formed by the tungsten film WF and the barrier metal film BME left in the contact opening CH2. The contact member DCN is formed by the tungsten film WF and the barrier metal film BME left in the contact opening CH3.

Thereafter, an aluminum film (not shown) is formed so as to cover the interlayer insulating film CIL, and the aluminum film is patterned to form the emitter electrode MEE, the gate lead-out wiring MGI, the gate electrode MGE, and the like (see FIG. 3 and the like). Next, the N-type buffer layer NBR and the P-type collector diffusion layer CDR are formed on the second main surface of the semiconductor substrate SUB. In addition, the collector electrode BEL (bottom surface electrode) is formed to complete the semiconductor device SED.

Next, an operation of the above-described semiconductor device SED will be described. First, when the insulated gate bipolar transistor is turned on, a voltage equal to or higher than a threshold voltage is applied to the gate electrode MGE. As a result, electrons are injected from the source diffusion layer SDR to the N-type region NSR (drift layer) in the semiconductor substrate SUB through channels, and PN-junction between the N-type region NSR and the collector diffusion layer CDR is forward biased, so that holes are injected from the collector diffusion layer CDR into the N-type region NSR.

The injected holes are prevented from escaping by the P-type floating diffusion layer FPR toward the source diffusion layer SDR (emitter), and the holes are accumulated in the N-type regions NSR and the floating diffusion layer FPR, thereby increasing a concentration of the holes. When the concentration of the holes in the N-type regions NSR or the like increases, the electrons injection from the source diffusion layer SDR is promoted, and a concentration of the electrons also increases. In this way, the concentration of carriers in the N-type regions NSR or the like is increased, so that the conductivity is modulated and turned on.

Next, when the insulated gate bipolar transistor is turned off, the voltage lower than the threshold voltage is applied to the gate electrode MGE. This causes the channels to disappear. The carriers (holes) accumulated in the N-type region NSR and the like are discharged to the emitter electrode MEE by a parasitic P-channel MOSFET (the floating diffusion layer FPR, the trench emitter electrode TEE of the emitter potential, the base diffusion layer BDR, and the like) formed on the trench emitter electrode TEE, and are turned off.

In the semiconductor device SED described above, when forming the polysilicon film PSF, the polysilicon film PSF is formed in two steps in order to reduce the grain size. At this time, it is assumed that a natural oxidation film SSM is formed on the upper surface of the first-layer polysilicon film PS1. The second-layer polysilicon film PS2 is formed so as to cover the natural oxidation film SSM.

Therefore, in the step after the polysilicon film PSF is formed, the semiconductor substrate SUB is sequentially processed in each step with the natural oxidation film SSM interposed between the first-layer polysilicon film PS1 and second-layer polysilicon film PS2.

After etching the entire surface of the polysilicon film PSF, the natural oxidation film SSM protrudes from the surface of polysilicon film PSF (see FIGS. 9 and 10). Natural oxidation film SSM protruding from the upper surface of the polysilicon film PSF is removed when removing the silicon oxide film HDL and the insulating film IF (see FIG. 13).

After forming the contact opening CH2, the upper surface of the polysilicon film PSF that is removed a protruding natural oxide film SSM is exposed in the bottom of the contact opening CH2. On the upper surface of the polysilicon film PSF exposed at the bottom of the contact opening CH2, the protruding natural oxide film SSM is exposed again when the upper surface of the trench gate lead-out electrode TGI (polysilicon film PSF) is retracted by the anisotropic etch process (see FIG. 16).

The protruding natural oxide film SSM exposed from the upper surface of the trench gate lead-out electrode TGI (polysilicon film PSF) is finally removed by isotropic dry etching using gases containing CF4 gas. (FIG. 18). By removing the protruding natural oxidation film SSM, the natural oxide film SSM is no longer positioned over the upper surface of the trench gate lead-out electrode TGI.

Thereby, as shown in FIG. 21 (FIG. 3), the gate lead-out contact member GCN is in good contact with the trench gate lead-out electrode TGI. As a result, it is possible to suppress an increase of a contact-resistance between the trench gate lead-out electrode TGI and the gate lead-out contact member GCN.

Further, in the method of manufacturing the semiconductor device described above, the contact opening CH2 that exposes the upper surface of the polysilicon film PSF is formed simultaneously with the other contact openings CH1 and CH3. Accordingly, it is possible to prevent an increase in the number of steps for forming the contact openings CH1 to CH3.

Furthermore, when forming the contact openings CH1 to CH3, after the trench emitter electrode TEE is exposed at the bottom of the contact opening CH1, until the trench gate lead-out electrode TGI is exposed at the bottom of the contact opening CH2, the trench insulating film EIF interposed between the trench emitter electrode TEE and the base diffusion layer BDR is also etched at the same time, and the upper surface of the trench insulating film EIF is recessed.

Thereby, an exposed area of the base diffusion layer BDR is expanded, a contact area between the common contact member CCN and the base diffusion layer BDR is increased, and a contact-resistance between a shared contact member CCN and the base diffusion layer BDR is reduced. As a result, it is possible to achieve a low contact-resistance in the step of forming the contact openings CH1 to CH3 without adding a step for expanding the contact area separately, which can contribute to a reduction in manufacturing costs.

In the method of manufacturing a semiconductor device described above, in the case where the polysilicon film PSF is formed in two steps, the case where the natural oxide film SSM is formed on the surface of the first-layer polysilicon film PS1 was taken as an example. mentioned and explained.

Figure 22:
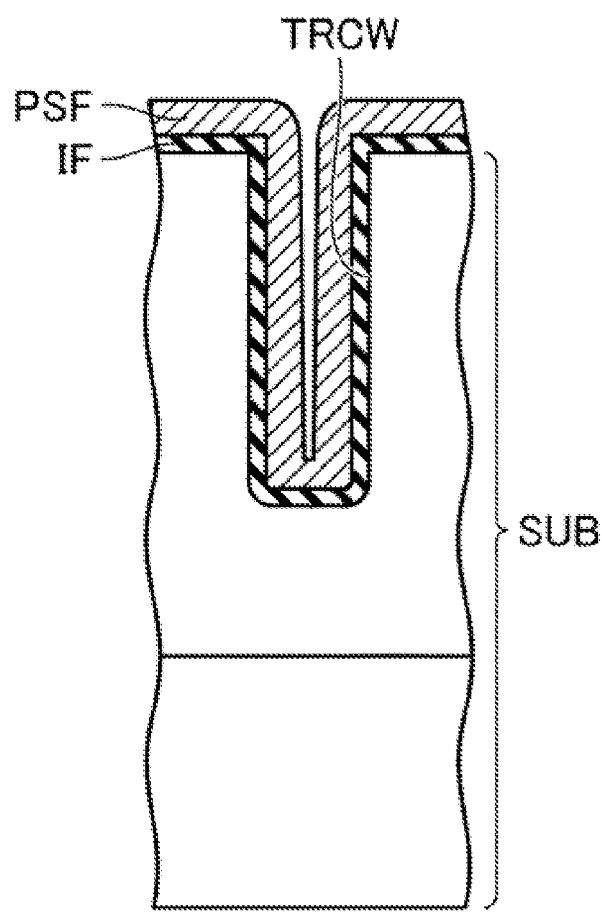
FIG. 22 is a partial cross-sectional view showing a step of other polysilicon film structure in the first embodiment.
Figure 23:
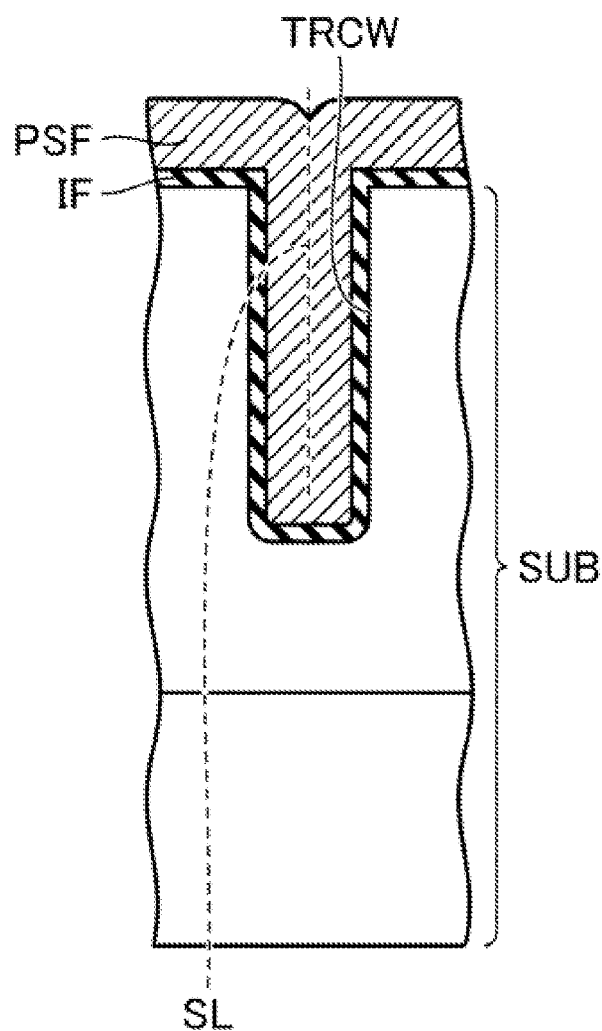
FIG. 23 is a partial cross-sectional view showing a step performed after the step shown in FIG. 22 in the first embodiment.
Figure 24:
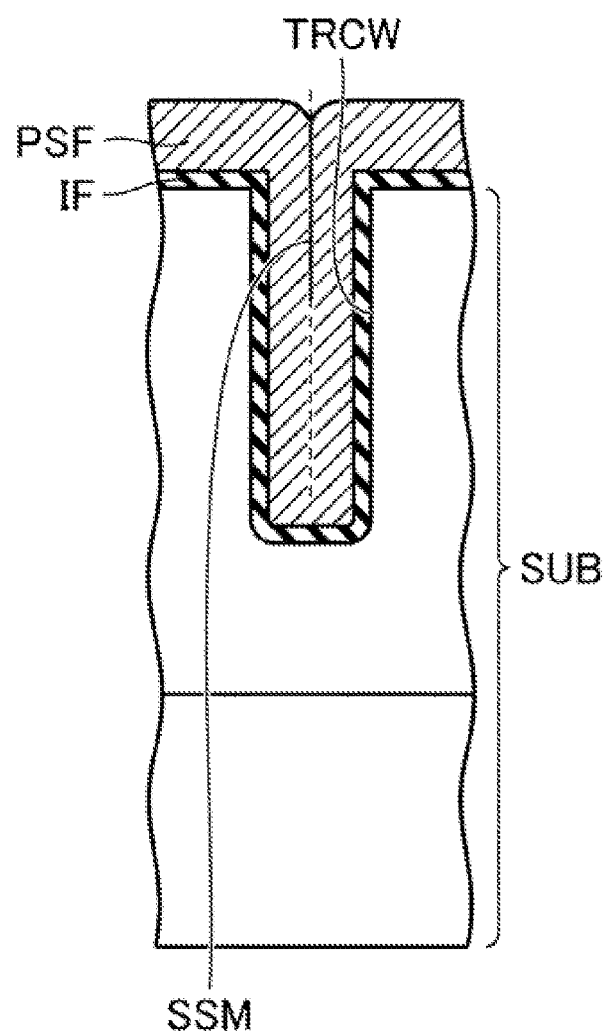
FIG. 24 is a partial cross-sectional view showing a step performed after the step shown in FIG. 23 in the first embodiment.

As the formation of the polysilicon film PSF, the polysilicon film PSF may be formed by one film formation. Even in such a case, it is assumed that a natural oxidation film is formed on a surface of the polysilicon film PSF. FIG. 22, FIG. 23, and FIG. 24 show how polysilicon film PSF is deposited in the trench TRCW in time series.

As shown in FIGS. 22, 23 and 24, the polysilicon film PSF is gradually deposited toward the center of trench TRCW from one side wall surface and the other side wall surface of trench TRCW facing each other. Therefore, at the time when the trench TRCW is filled with the polysilicon film PSF, the polysilicon film PSF located in the center of the trench TRCW has a seam SL with weak intermolecular bonding. By diffusing oxygen in the atmosphere into the seam SL, the natural oxidation film SSM is formed.

As described above, even if the natural oxidation film SSM is formed in the seam SL of the polysilicon film PSF, eventually the natural oxidation film SSM is removed by isotropic dry etching process using gases containing CF4 gas as same as the case where the polysilicon film PSF is formed in two steps.

Figure 25:
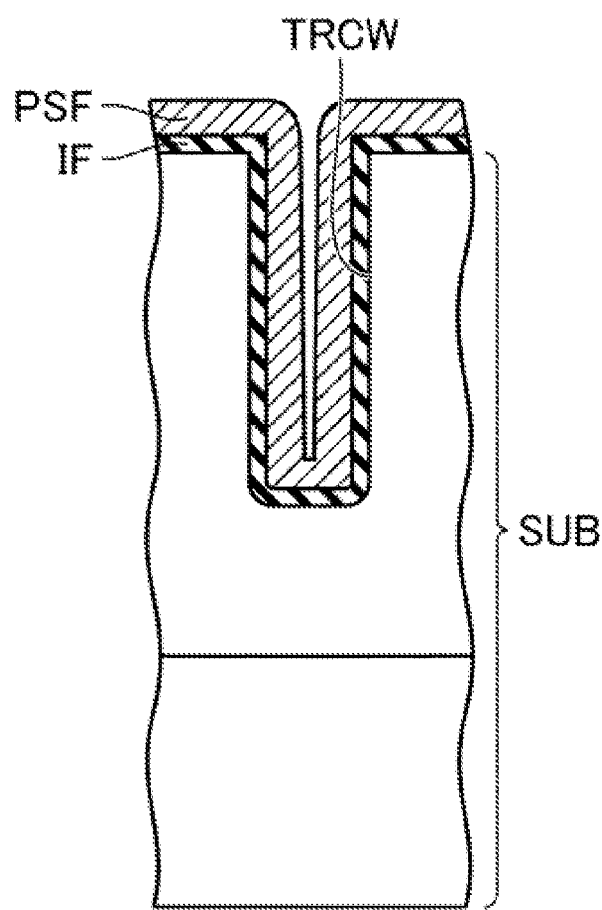
FIG. 25 is a partial cross-sectional view showing a step of further other polysilicon film structure in the first embodiment.
Figure 26:
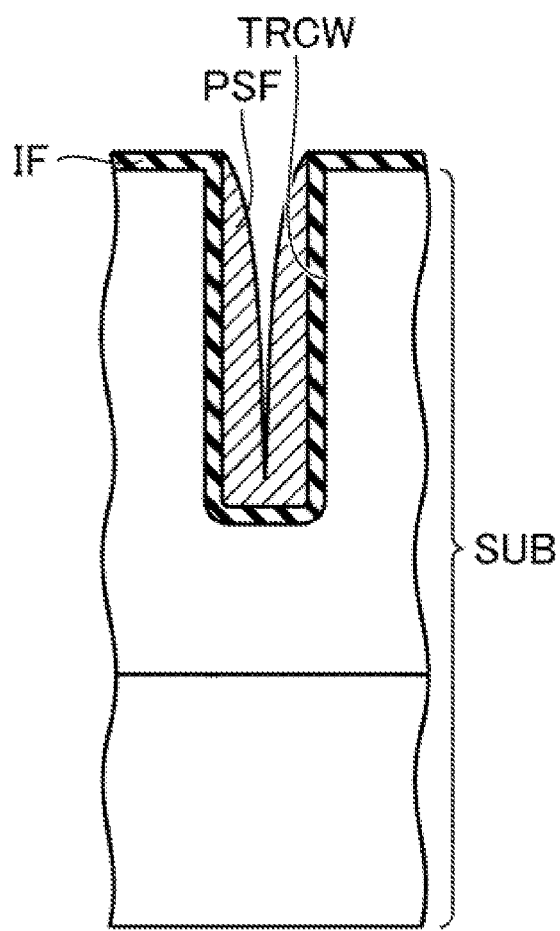
FIG. 26 is a partial cross-sectional view showing a step performed after the step shown in FIG. 25 in the first embodiment.
Figure 27:
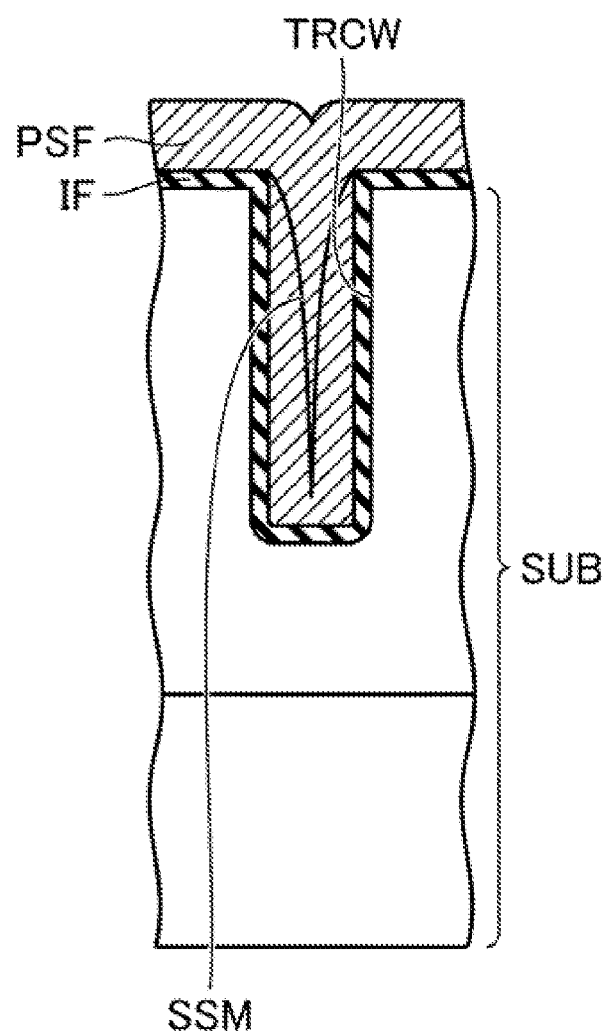
FIG. 27 is a partial cross-sectional view showing a step performed after the step shown in FIG. 26 in the first embodiment.

Further, as for the formation of the polysilicon film PSF, in order to improve the embedding property, a etch-back process may be performed on the entire surface of the polysilicon film PSF during a formation of the polysilicon film PSF. Even in such a case, it is assumed that the natural oxidation film is formed on the surface of the polysilicon film PSF. FIG. 25, FIG. 26, and FIG. 27 are shown that how the polysilicon film PSF is deposited in the trench TRCW in time series.

After polysilicon film PSF is formed halfway as shown in FIG. 25, the entire surface of the polysilicon film PSF is etched back as shown in FIG. 26. Next, as shown in FIG. 27, the polysilicon film PSF is further formed so as to cover the polysilicon film PSF performed the etch-back process.

In this polysilicon film PSF formation, it is assumed that the natural oxidation film SSM is formed at the interface between the polysilicon film PSF performed entire etch-back process and the polysilicon film PSF covering that etch backed polysilicon film PSF.

As described above, even if the natural oxidation film SSM is formed at the interface between the polysilicon films PSF and the polysilicon films PSF, eventually the natural oxidation film SSM is removed by isotropic dry etching process using gases containing CF4 gas as same as the case where the polysilicon film PSF is formed in two steps.

SECOND EMBODIMENT

Figure 28:
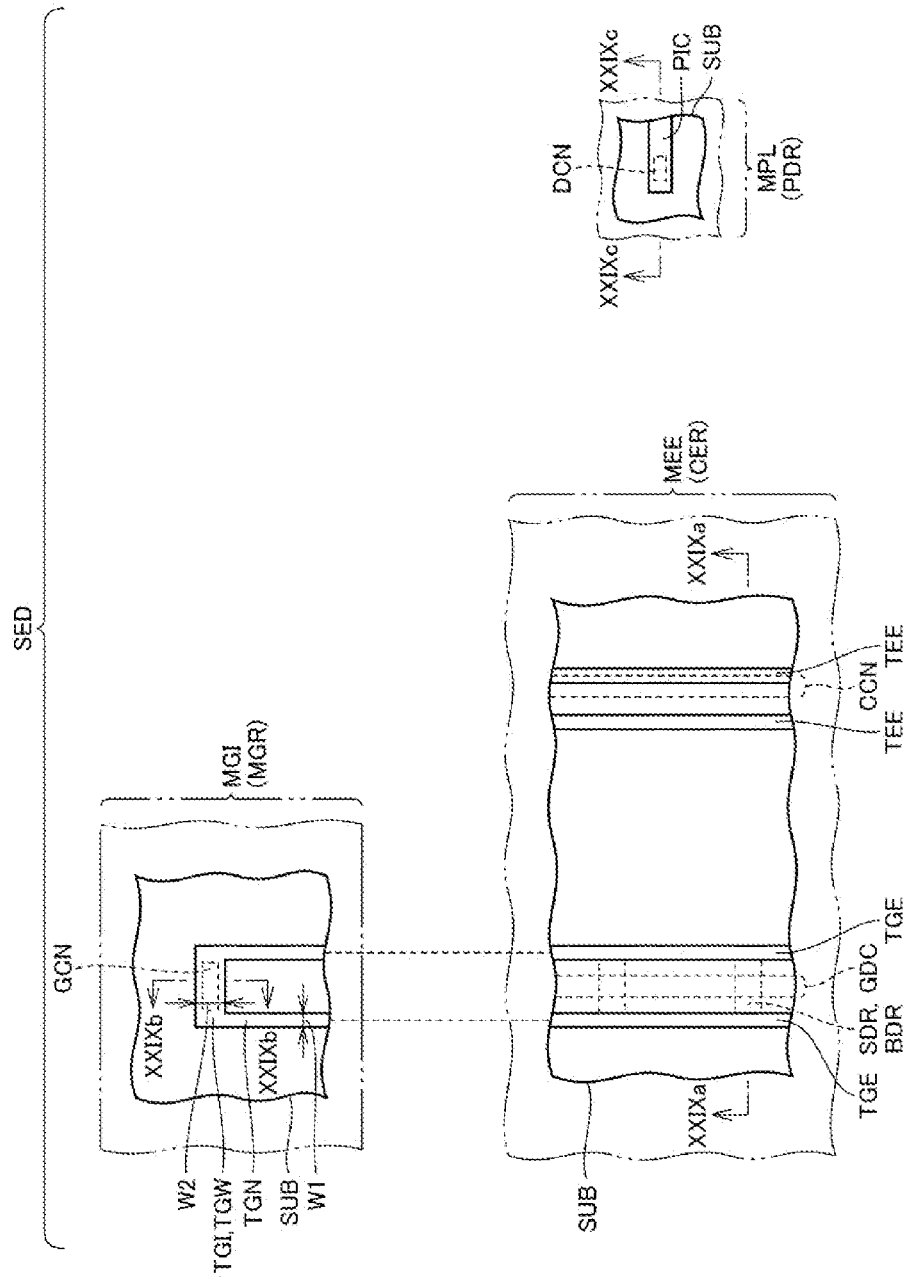
FIG. 28 is a partial plan view illustrating an exemplary plane structure of a semiconductor device in a second embodiment.
Figure 29:
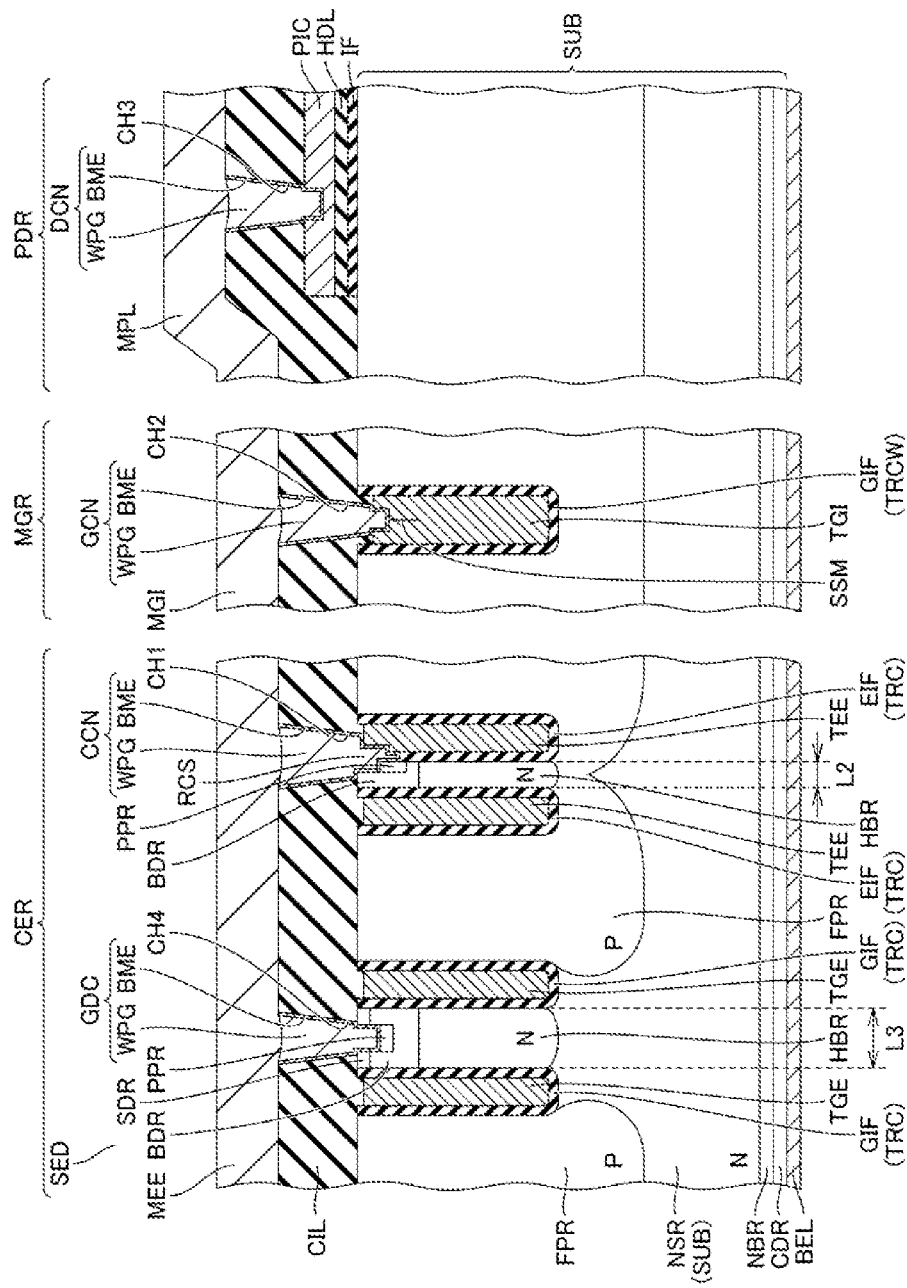
FIG. 29 is a cross-sectional view showing a cross-sectional structure at each of a line XXIXa-XXIXa, a line XXIXb-XXIXb and a line XXIXc-XXIXc shown in FIG. 28 together in the second embodiment.

Here, an exemplary GGEE type semiconductor device will be described. The GGEE type semiconductor device is applied to applications that require stable operation. First, a cell region CER will be described. As shown in FIGS. 28 and 29, one trench emitter electrode TEE (first trench electrode) and other trench emitter electrode TEE (fourth trench electrode) are located spaced apart from each other in a first direction. A distance between the one trench emitter electrode TEE and the other trench emitter electrode TEE is a space L2. The one trench emitter electrode TEE and the other trench emitter electrode TEE extend in a second direction intersecting the first direction, respectively.

One trench gate electrode TGE (fifth trench electrode) and other trench gate electrode TGE (sixed trench electrode) are located spaced apart in the first direction. A distance between the one trench gate electrode TGE and the other trench gate electrode TGE is a space L3. The one trench gate electrode TGE and the other trench gate electrode TGE each extend in the second direction intersecting the first direction.

Further, the one trench emitter electrode TEE and the other trench emitter electrode TEE are spaced apart from the one trench gate electrode TGE and the other trench gate electrode TGE in the first direction.

In a region (first region) of a semiconductor substrate SUB located between the one trench emitter electrode TEE and the other trench emitter electrode TEE, a P-type base diffusion layer BDR is formed over a predetermined depth from a first main surface. In the base diffusion layer BDR, a P+ layer PPR having a higher P-type impurity concentration is formed.

In a region (second region) of the semiconductor substrate SUB located between the one trench gate electrode TGE and the other trench gate electrode TGE, an N-type source diffusion layer SDR is formed over a predetermined depth from the first main surface. The base diffusion layer BDR is formed from a bottom of the source diffusion layer SDR to a predetermined depth.

An interlayer insulating film CIL is formed to cover the first main surface of the semiconductor substrate SUB. A shared contact member CCN, a gate contact member GDC, and a gate lead-out contact member GCN are formed so as to penetrate the interlayer insulating film CIL. Since other configurations are the same as those of the semiconductor device SED illustrated in FIGS. 2 and 3, the same members are denoted by the same reference numerals, and the explanation thereof is not repeated unless otherwise required.

In the semiconductor device SED described above, in particular, it is assumed that a natural oxidation film SSM is formed in the polysilicon film when the trench gate lead-out electrode TGI is formed. In case of the natural oxidation film SSM is formed, a desired etching process is performed so that the natural oxidation film SSM does not protrude beyond the upper surface of the trench gate lead-out electrode TGI (the upper surface of the polysilicon film).

Next, an exemplary manufacturing method of the above-described semiconductor device SED will be described. An arrangement pattern of a trench gate electrode TGE (trench TRC) and a trench emitter electrode TEE (trench TRC) only differs from the arrangement pattern of the trench gate electrode TGE and the trench emitter electrode TEE in the semiconductor device SED described in the first embodiment, the semiconductor device SED in the second embodiment is manufactured by substantially the same manufacturing method as the manufacturing method of the semiconductor device SED in the first embodiment.

Figure 30:
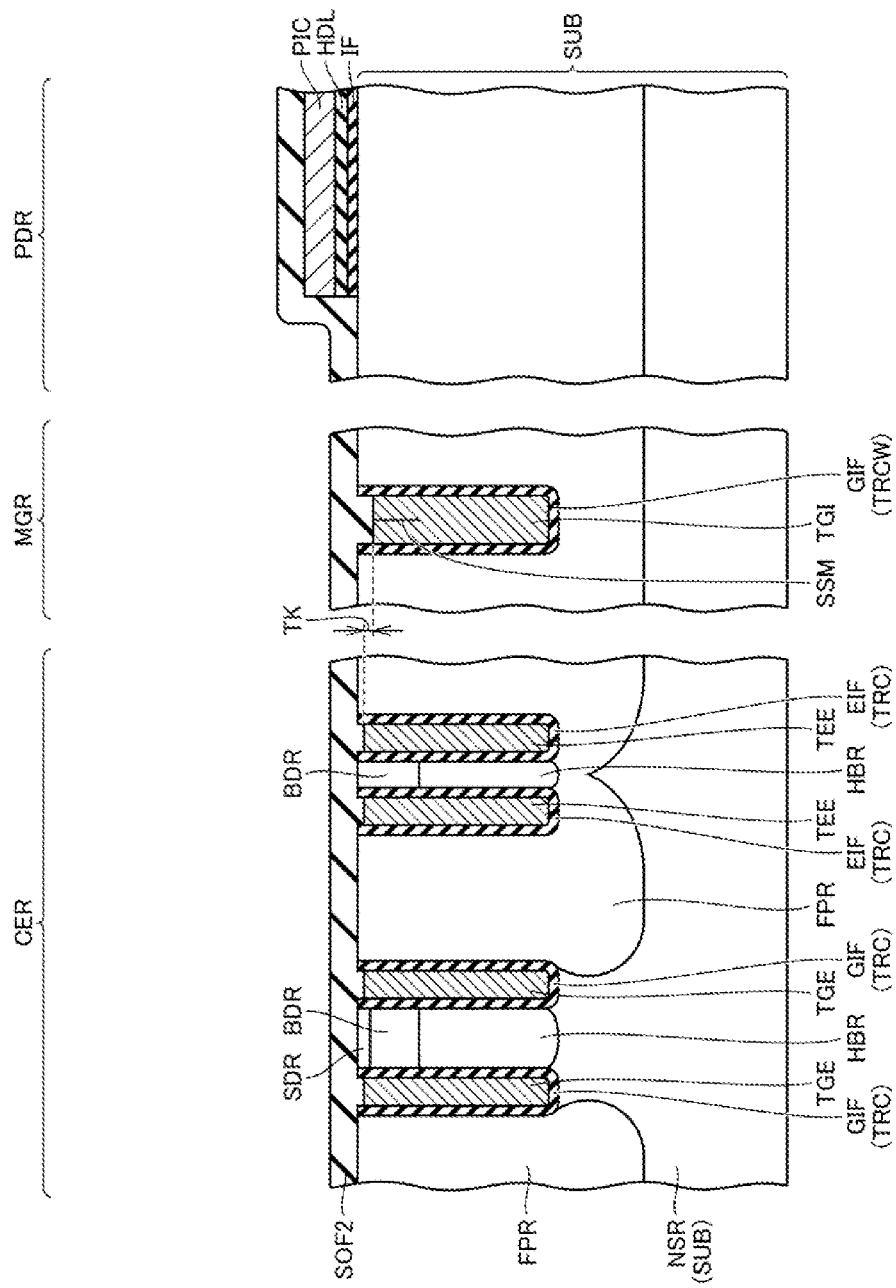
FIG. 30 is a cross-sectional view showing a step of a manufacturing method of a semiconductor device in the second embodiment.

After substantially the same steps as those shown in FIGS. 4 to 13, a silicon oxide film SOF2 is formed so as to cover the first main surface of the semiconductor substrate SUB as shown in FIG. 30. Next, a photoresist pattern (not shown) for forming the base diffusion layer BDR is formed by performing a predetermined photolithography process. Next, the base diffusion layer BDR is formed by implanting P-type impurities using the photoresist pattern as an implantation mask.

Next, after the photoresist pattern is removed, a predetermined photolithography process is performed to form a photoresist pattern (not shown) for forming the source diffusion layer SDR. Next, the source diffusion layer SDR is formed by implanting N-type impurities using the photoresist pattern as an implantation mask. Thereafter, the photoresist pattern is removed.

As a result, the base diffusion layer BDR is formed in the regions (first regions) of the semiconductor substrate SUB located between the one trench emitter electrode TEE and the other trench emitter electrode TEE adjacent to each other. In addition, the base diffusion layer BDR and the source diffusion layer SDR are formed in regions (second regions) of the semiconductor substrate SUB located between the one trench gate electrode TGE and the other trench gate electrode TGE adjacent to each other. Thereafter, the silicon oxide film SOF2 is removed.

Figure 31:
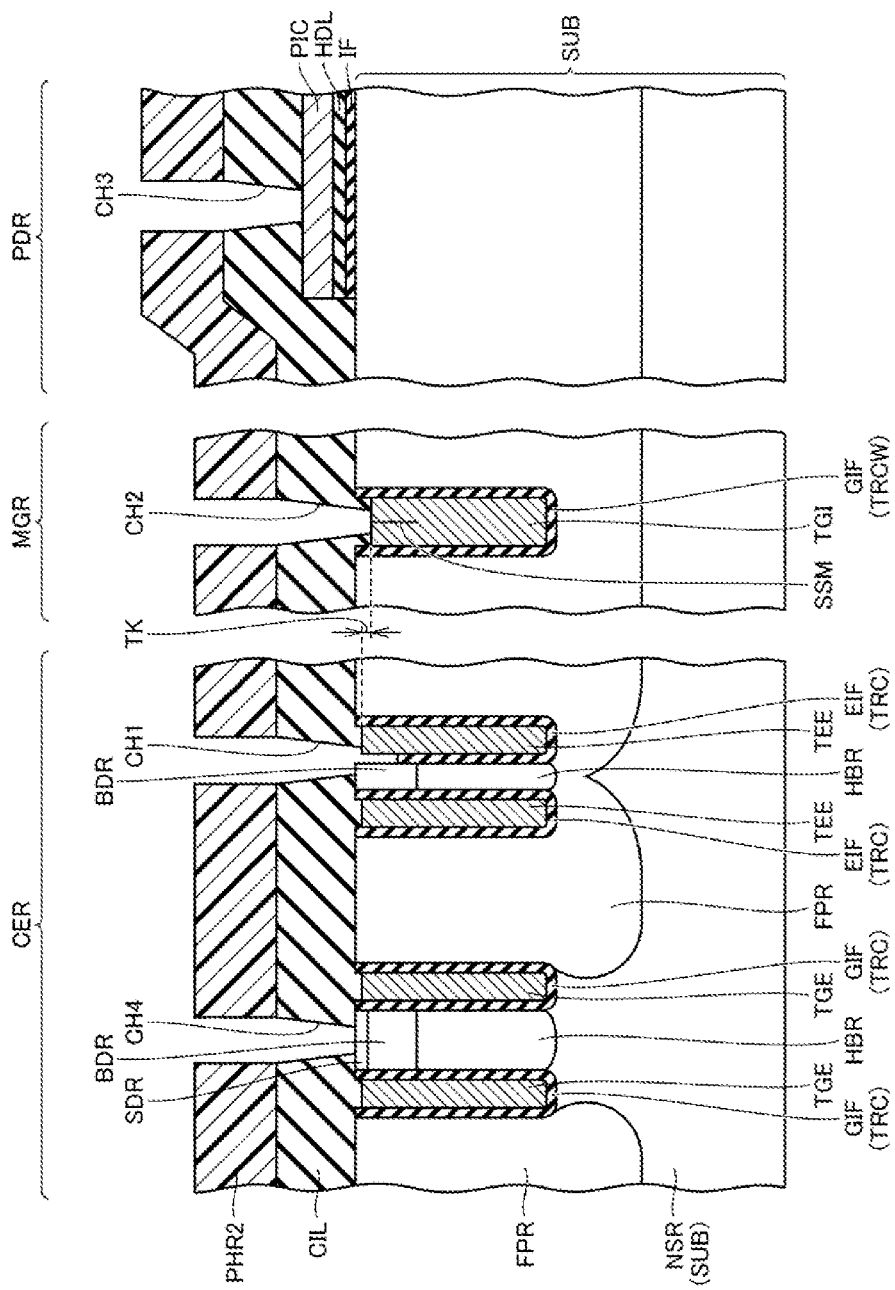
FIG. 31 is a cross-sectional view showing a step performed after the step shown in FIG. 30 in the second embodiment.
Figure 32:
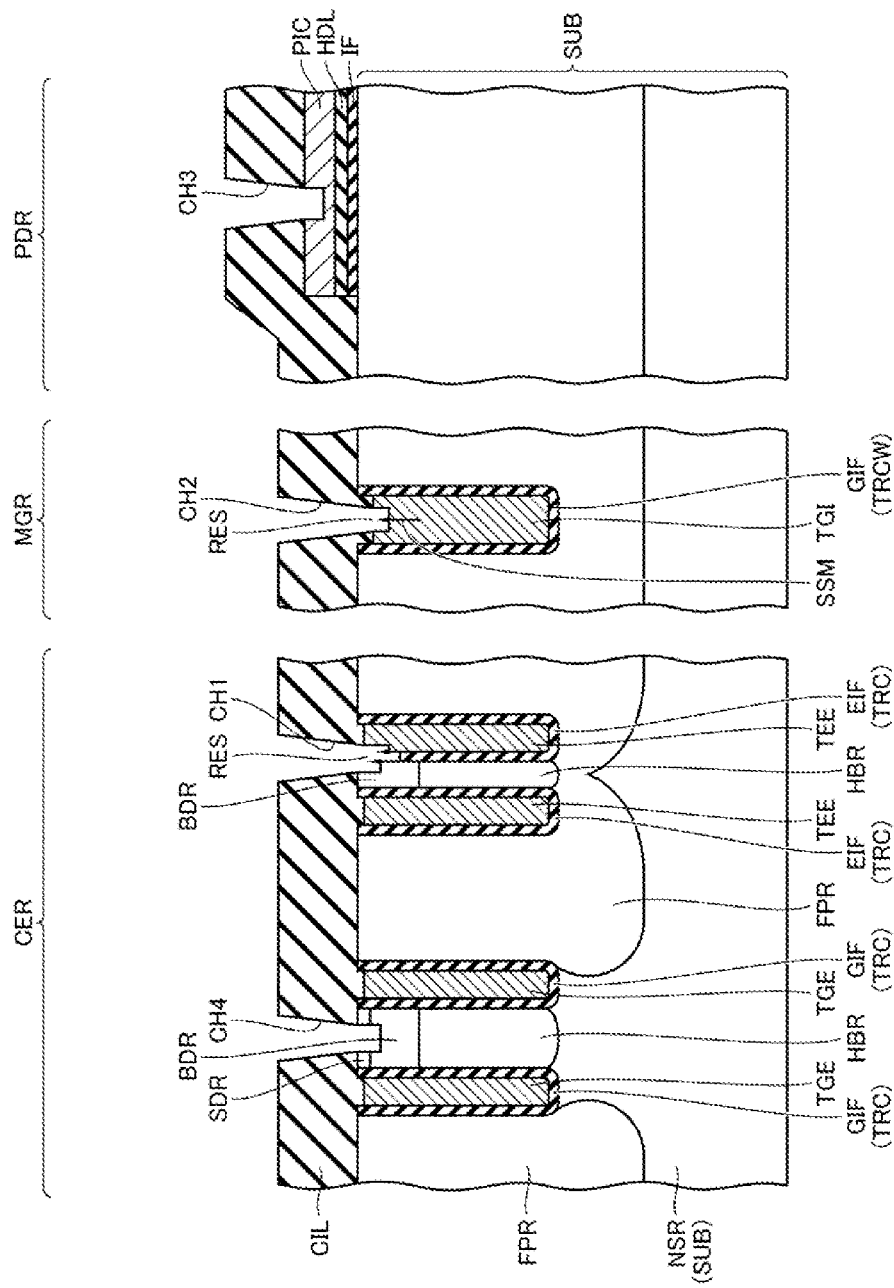
FIG. 32 is a cross-sectional view showing a step performed after the step shown in FIG. 31 in the second embodiment.

Next, the interlayer insulating film CIL is formed so as to cover the first main surface of the semiconductor substrate SUB (see FIG. 31). Next, by performing a predetermined photolithography process, a photoresist pattern PHR2 for forming a contact opening is formed in the interlayer insulating film CIL. Next, as shown in FIG. 31, an etching process is performed on the interlayer insulating film CIL using the photoresist pattern PHR2 as an etching mask. By this etching process, a contact opening CH1 (first contact opening), a contact opening CH2 (second contact opening), a contact opening CH3 (fourth contact opening), and a contact opening CH4 (third contact opening) are simultaneously formed.

At this time, as described with respect to a step illustrated in FIG. 15, since an aspect ratio (an opening depth DC against an opening width WC) is high (1.4 to 2.5), an anisotropic dry etching process is applied as an etching process. By this anisotropic etch process, the contact opening CH1 and the like are formed in a tapered shape. In addition, since a position of an upper surface of the trench gate lead-out electrode TGI (polysilicon film PSF) is lower than a position of an upper surface of the trench emitter electrode TEE (polysilicon film PSF) by the thickness TK, during etching a portion corresponding to the thickness TK, the upper surface of the trench insulating film EIF is lowered (recessed), and the exposed area of the base diffusion layer BDR is expanded. Thereafter, the photoresist pattern PHR2 is removed.

Next, as in a step shown in FIG. 16, an anisotropic dry etching process is performed. As a result, as shown in FIG. 25, the upper surface of the trench emitter electrode TEE exposed at a bottom of the contact opening CH1 is retracted, and an upper surface of the base diffusion layer BDR is retracted. Upper surface of the trench gate lead-out electrode TGI exposed at the bottom of the contact opening CH2 is retracted. At this time, the source diffusion layer SDR is etched at a bottom of the contact opening CH4, and the base diffusion layer BDR is also exposed. Upper surface of wiring PIC exposed at the bottom of the contact opening CH3 is retracted.

Due to this anisotropic dry etching, a part of the trench insulating film EIF, a part of silicon (semiconductor substrate SUB, polysilicon) and the like remain as residue RES at the bottom of the contact opening CH1. Further, due to an exposed upper surface of the trench gate lead-out electrode TGI is recessed at the bottom of the contact opening CH2, the natural oxidation film SSM is exposed as a residue RES.

Figure 33:
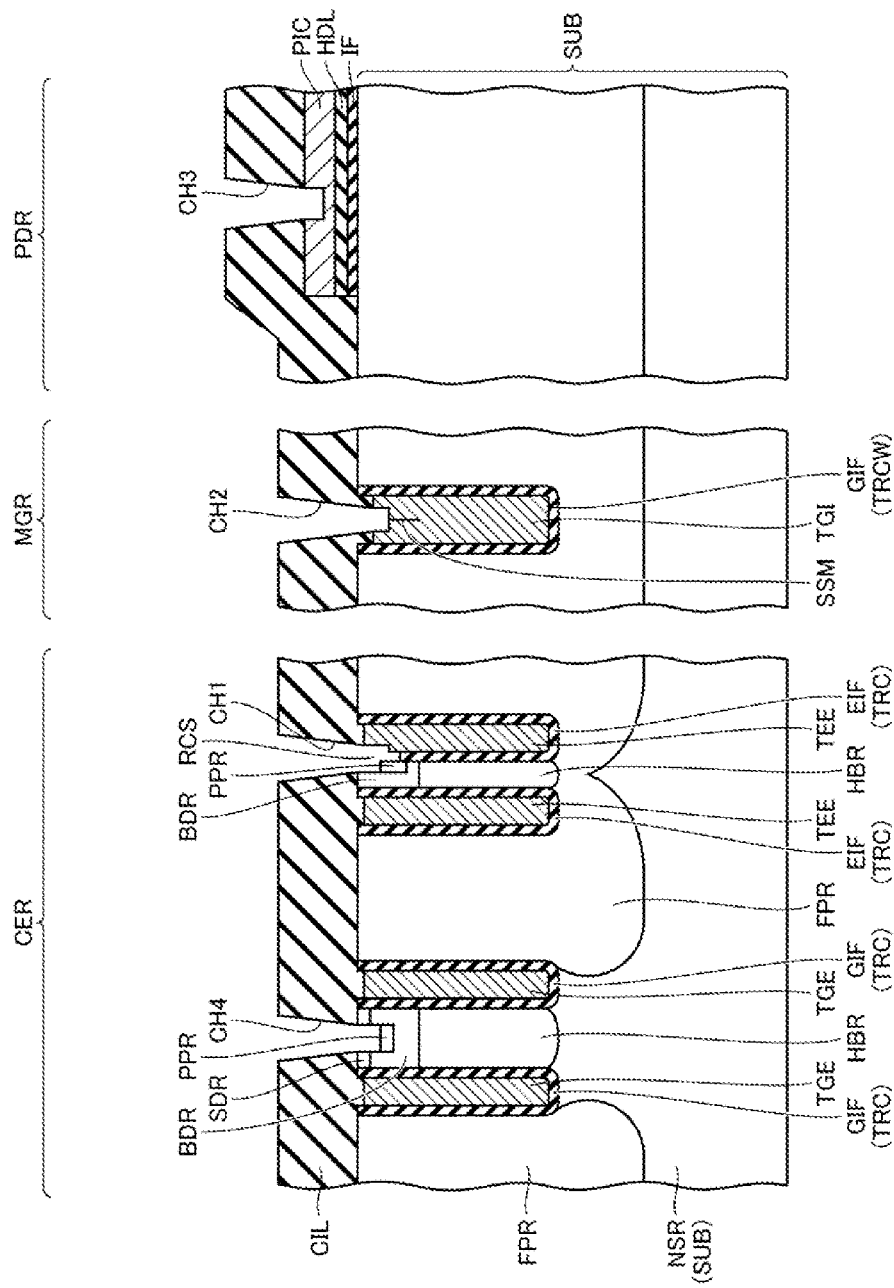
FIG. 33 is a cross-sectional view showing a step performed after the step shown in FIG. 32 in the second embodiment.

Here, an isotropic dry etching process using gases containing CF4 gas is performed as the etching process (second etching process). As a result, as shown in FIG. 33, by this isotropic dry etching process, the natural oxidation film SSM exposed as a residue RES at a bottom of the contact opening CH2 is removed. Also, the residue RES is removed at the bottom of the contact opening CH1 to form a recess RCS.

Next, P-type impurities is implanted through the contact openings CH1 to CH4. At this time, the P+ layer PPR is formed on the base diffusion layer BDR exposed at the bottom of the contact opening CH1. And the P+ layer PPR is formed on the base diffusion layer BDR exposed at the bottom of the contact opening CH4.

Figure 34:
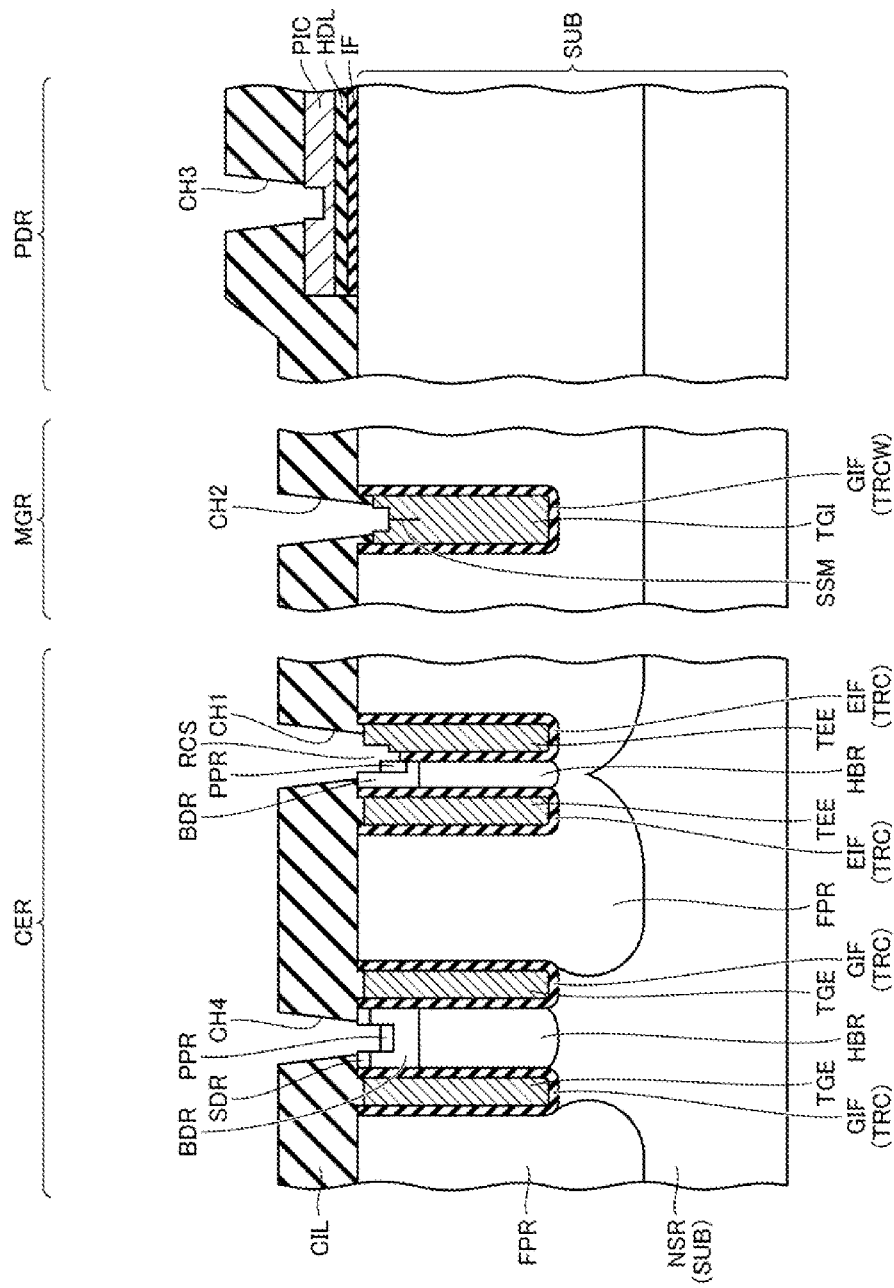
FIG. 34 is a cross-sectional view showing a step performed after the step shown in FIG. 33 in the second embodiment.

Next, as same as in the step shown in FIG. 19, the interlayer insulating film CIL is performed to a wet etching process. Thereby, as shown in FIG. 34, the opening widths of the contact opening CH1 and the contact opening CH4 are widened, so that an upper surface of the source diffusion layer SDR into which the P-type impurities PM is not implanted is exposed.

Figure 35:
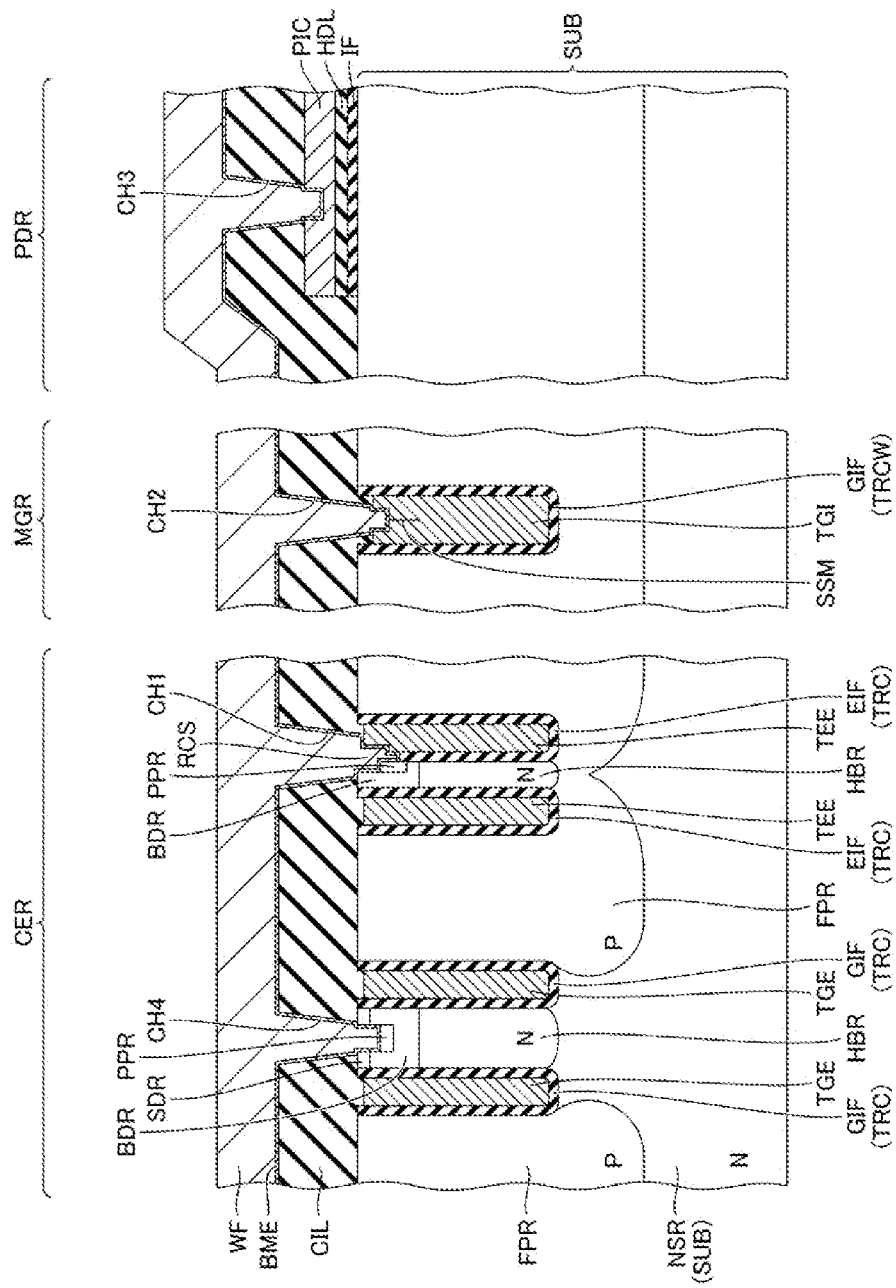
FIG. 35 is a cross-sectional view showing a step performed after the step shown in FIG. 34 in the second embodiment.

Next, similarly to a step shown in FIG. 20, as shown in FIG. 35, a barrier metal film BME is formed so as to cover the interlayer insulating film CIL including inner wall surfaces of the contact opening CH1 to CH4. Next, a tungsten film WF is formed so as to cover the barrier metal film BME. Next, the tungsten film WF and the barrier metal film BME located on an upper surface of the interlayer insulating film CIL are removed by performing an entire etch-back process on the tungsten film WF and the like.

Figure 36:
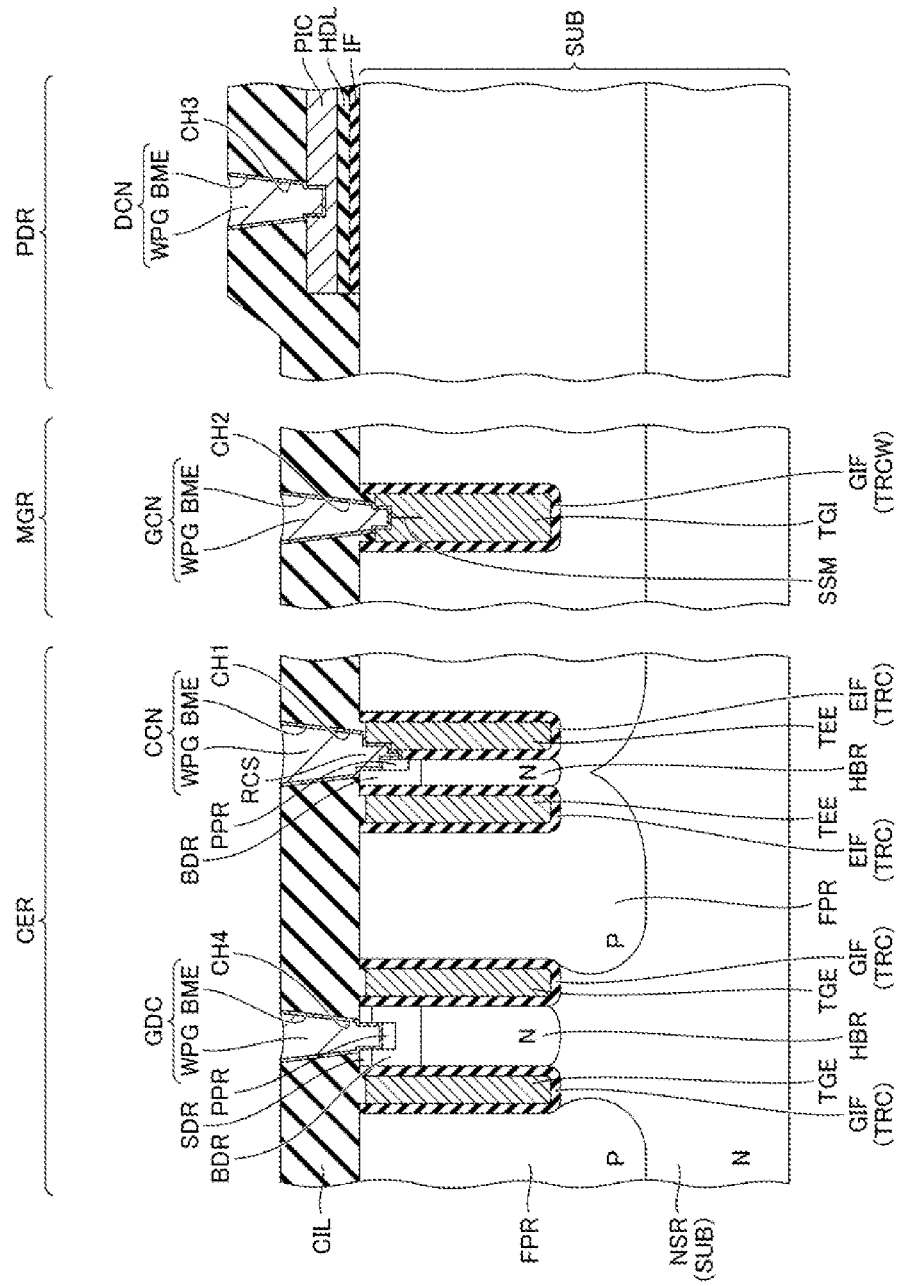
FIG. 36 is a cross-sectional view showing a step performed after the step shown in FIG. 35 in the second embodiment.

As a result, as shown in FIG. 36, the shared contact member CCN is formed in the contact opening CH1. A gate lead-out contact member GCN is formed in the contact opening CH2. A contact member DCN is formed in the contact opening CH3. The gate contact member GDC is formed in the contact opening CH4. After that, the semiconductor device SED is completed by forming an emitter electrode MEE, a gate lead-out wiring MGI, a gate electrode MGE, and the like.

In the semiconductor device SED described above, it is assumed that the natural oxidation film SSM is formed on the surface of the polysilicon film PS1, and the natural oxidation film SSM is interposed between the polysilicon film PS1 and the polysilicon film PS2. In that case, when the upper surface of the trench gate lead-out electrode TGI is recessed, it is assumed that the natural oxidation film SSM protrudes from the upper surface of the trench gate lead-out electrode TG.

In the manufacturing method of the semiconductor device SED described above, the protruding natural oxide film SSM exposed from the upper surface of the trench gate lead-out electrode TGI (polysilicon film PSF) is finally removed by isotropic dry etching using gases containing CF4 gas. (FIG. 33). By removing the protruding natural oxidation film SSM, the natural oxide film SSM is no longer positioned over the upper surface of the trench gate lead-out electrode TGI.

Thereby, as shown in FIG. 36 (FIG. 29), the gate lead-out contact member GCN is in good contact with the trench gate lead-out electrode TGI. As a result, it is possible to suppress an increase of a contact-resistance between the trench gate lead-out electrode TGI and the gate lead-out contact member GCN.

Further, in the method of manufacturing the semiconductor device described above, the contact opening CH2 is formed simultaneously with the other contact openings CH1, CH3 and CH4. Accordingly, it is possible to prevent an increase in the number of steps for forming the contact openings CH1 to CH4.

Furthermore, when forming the contact openings CH1 to CH4, after the trench emitter electrode TEE is exposed at the bottom of the contact opening CH1, until the trench gate lead-out electrode TGI is exposed at the bottom of the contact opening CH2, the trench insulating film EIF interposed between the trench emitter electrode TEE and the base diffusion layer BDR is also etched at the same time, and the upper surface of the trench insulating film EIF is recessed.

Thereby, an exposed area of the base diffusion layer BDR is expanded, a contact area between the common contact member CCN and the base diffusion layer BDR is increased, and a contact-resistance between a shared contact member CCN and the base diffusion layer BDR is reduced. As a result, it is possible to achieve a low contact-resistance in the step of forming the contact openings CH1 to CH4 without adding a step for expanding the contact area separately, which can contribute to a reduction in manufacturing costs.

Note that, even when the natural oxidation film SSM is formed due to the formation of the seam in the polysilicon film PSF (see FIGS. 23 to 25), eventually the protruding natural oxidation film SSM is removed by isotropic dry etching process using gases containing CF4 gas.

In addition, even when the natural oxidation film SSM is formed due to the polysilicon film PSF is etch backed (see FIGS. 26 to 28), eventually the protruding natural oxidation film SSM is removed by isotropic dry etching process using gases containing CF4 gas.

THIRD EMBODIMENT

Figure 37:
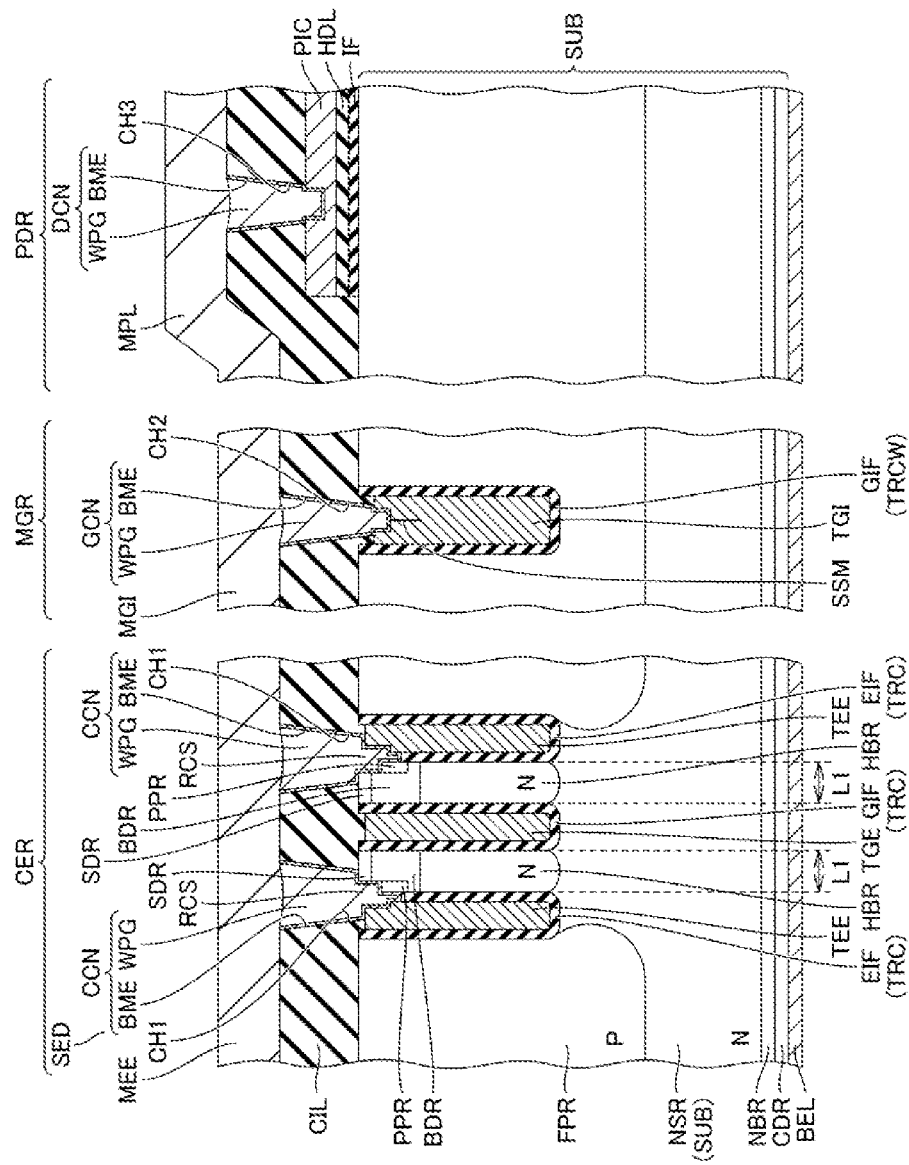
FIG. 37 is a partial plan view illustrating an exemplary plane structure of a semiconductor device in a third embodiment.

Here, an exemplary EGE type semiconductor device will be described. The EGE type semiconductor device SED is applied to applications requiring high speed. As shown in FIG. 37, in a cell region CER, one trench emitter electrode TEE (first trench electrode), a trench gate electrode TGE (third trench electrode) and other trench emitter electrode TEE are formed.

The one trench emitter electrode TEE, the trench gate electrode TGE, and the other trench emitter electrode TEE are formed between the one trench emitter electrode TEE and the other trench emitter electrode TEE in such a manner that the trench gate electrode TGE are located at a distance (space L1) from each other. Since other configurations are the same as those of the semiconductor device SED shown in FIGS. 2 and 3, the same members are denoted by the same reference numerals, and the explanation thereof will not be repeated unless otherwise required.

In semiconductor device SED described above, in particular, it is assumed that a natural oxidation film SSM is formed on the top surface of polysilicon film when the trench gate lead-out electrode TGI is formed. In case of the natural oxidation film SSM is formed, a desired etching process is performed so that the natural oxidation film SSM does not protrude beyond the upper surface of the trench gate lead-out electrode TGI (the upper surface of the polysilicon film).

Next, a manufacturing method of the semiconductor device SED described above will be described. The arrangement pattern of the trench gate electrode TGE (trench TRC) and the trench emitter electrodes TEE (trench TRC) only differ from the arrangement pattern of the trench gate electrode TGE and the trench emitter electrode TEE in the semiconductor device SED shown in FIG. 3 and the like, and the semiconductor device SED is manufactured by substantially the same manufacturing method as manufacturing method of the semiconductor device SED described in the first embodiment.

In the above-described semiconductor device SED, it is assumed that a natural oxidation film SSM is formed in polysilicon film PSF, and natural oxidation film SSM protrudes from upper surface of the trench gate electrode TGI. In this case, as same as described in the first embodiment, the protruding natural oxide film SSM exposed from the upper surface of the trench gate lead-out electrode TGI (polysilicon film PSF) is finally removed by isotropic dry etching using gases containing CF4 gas. (FIG. 17). By removing the protruding natural oxidation film SSM, the natural oxide film SSM is no longer positioned over the upper surface of the trench gate lead-out electrode TGI.

Thereby, as shown in FIG. 37, the gate lead-out contact member GCN is in good contact with the trench gate lead-out electrode TGI. As a result, it is possible to suppress an increase of a contact-resistance between the trench gate lead-out electrode TGI and the gate lead-out contact member GCN.

Note that, in each embodiment, the case where the trench gate lead-out electrode TGI and the like is formed of the polysilicon film PSF as a conductive film has been described. The conductive film is not limited to the polysilicon film PSF, as long as a conductive film on which a natural oxide film is formed, it is possible to suppress an increase in contact-resistance by applying the above-described method.

Moreover, although the case of removing the natural oxidation film SSM as a residue has been described, it is also possible to remove, for example, particles as oxide or silicon adhering to the upper surface of the trench gate lead-out electrode TGI and the like can also be removed. Furthermore, although the case of removing the natural oxidation film SSM by isotropic dry etching using gases containing CF4 gas, it is not limited to gases containing CF4 gas as long as natural oxidation film SSM can be removed.

The semiconductor device and method of manufacturing the same described in the embodiments can be variously combined as needed. Dependencies of the claims according to this combination are also planned.

Although the invention made by the present inventor has been specifically described based on the embodiment, the present invention is not limited to the embodiment described above, and it is needless to say that various modifications can be made without departing from the gist thereof.

What is claimed is:

1. A manufacturing method of a semiconductor device, the manufacturing method comprising the steps of:
    (a) forming a first trench having a first width and a second trench having a second width greater than the first width on a semiconductor substrate having a first main surface and a second main surface opposite to the first main surface;
    (b) forming a first trench electrode and a second trench electrode by sequentially laminating a first conductive film and a second conductive film to fill the first trench and the second trench, respectively;
    (c) forming an interlayer insulating film on the first main surface;
    (d) forming a first contact opening penetrating through the interlayer insulating film and exposing an upper surface of the first trench electrode and the first main surface, and forming a second contact opening penetrating through the interlayer insulating film and exposing an upper surface of the second trench electrode;
    (e) etching the upper surface of the first trench electrode and the first main surface exposed from the first contact opening, and the upper surface of the second trench electrode exposed from the second contact opening, respectively; and
    (f) filling a contact member in the first contact opening and the second contact opening, wherein
    the step of (e) includes:
        (e1) retreating the upper surface of the first trench electrode and the first main surface exposed from the first contact opening, and the upper surface of the second trench electrode exposed from the second contact opening, in a thickness direction of the semiconductor substrate respectively; and
        (e2) after the step of (e1), removing residue left inside the first contact opening and the second contact opening.

2. The manufacturing method of the semiconductor device according to claim 1, wherein
    in the step of (e2), the method of the removing residue includes an isotropic dry etching using gases containing CF4 gas.

3. The manufacturing method of the semiconductor device according to claim 2, wherein in the step of (e1), the method of an anisotropic dry etching is performed.

4. The manufacturing method of the semiconductor device according to claim 1, wherein
    in the step of (b), a natural oxidation film is formed between the first conductive film and the second conductive film; and
    in the step of (e2), the residue left inside the first contact opening and the second contact opening is a part of the natural oxidation film.

5. The manufacturing method of the semiconductor device according to claim 1, wherein the first contact opening is formed so as to straddle between the first trench electrode and the first main surface, in plan view.

6. The manufacturing method of the semiconductor device according to claim 1, wherein
    in the step of (a), the semiconductor substrate has a first conductivity type, and
    the manufacturing method further comprises the steps of
        (f) before the step of (c), forming a first impurity region of a second conductivity type opposite to the first conductivity type in a first region on the first main surface and contacting with the first trench, and
    in the step of (d), the first main surface includes the first impurity region.

7. The manufacturing method of the semiconductor device according to claim 1, further comprising the steps of:
    (b1) in the step of (b), performing an etch-back process between the sequential lamination of the first conductive film and the second conductive film.

8. The manufacturing method of the semiconductor device according to claim 1, wherein the first conductive film and the second conductive film are polysilicon films.

9. The manufacturing method of the semiconductor device according to claim 1, wherein
    in the step of (b), the first trench electrode is filled in the first trench via a trench insulating film, and
    in the step of (e1), retreating an upper surface of the trench insulating film exposed from the first contact opening.

10. The manufacturing method of the semiconductor device according to claim 1, wherein
    in the step of (d), the first contact opening and the second contact opening are formed simultaneously.

11. The manufacturing method of the semiconductor device according to claim 1, wherein
    in the step of (a), a third trench having the first width is formed so as to contact with the first main surface and be separated apart from the first trench via the first main surface, and
    in the step of (b), a third trench electrode is formed by sequentially laminating the first conductive film and the second conductive film to fill the third trench.

12. The manufacturing method of the semiconductor device according to claim 1, wherein
    in the step of (a), a fourth trench having the first width is formed so as to contact with the first main surface and be separated apart from the first trench via the first main surface, and a fifth trench and a sixth trench are formed so as to be separated apart from each other, in the step of (b), a fourth trench electrode, a fifth trench electrode and a sixth trench electrode are formed by sequentially laminating the first conductive film and the second conductive film to fill the fourth trench, the fifth trench, and the sixth trench, respectively, in the step of (d), a third contact opening is formed to penetrate through the interlayer insulating film and exposing the first main surface between the fifth trench electrode and the sixth trench electrode, in the step of (f), the contact member is filled in the third contact opening, and in the step of (e1), the first main surface exposed from the third contact opening is retreated.

13. The manufacturing method of the semiconductor device according to claim 12, wherein in the step of (d), the first contact opening, the second contact opening, and the third contact opening are formed simultaneously.

\* \* \* \* \*